United States Patent
Noto et al.

[11] Patent Number: 6,031,257
[45] Date of Patent: Feb. 29, 2000

[54] SEMICONDUCTOR INTEGRATED CIRCUIT DEVICE

[75] Inventors: Takayuki Noto, Higashimurayama; Eiji Oi, Kawagoe; Yahiro Shiotsuki, Hiratsuka; Kazuo Kato, Kitamoto; Hideki Ohagi, Nakakoma-gun, all of Japan

[73] Assignee: Hitachi, Ltd., Tokyo, Japan

[21] Appl. No.: 09/095,745

[22] Filed: Jun. 11, 1998

[30] Foreign Application Priority Data

Jun. 13, 1997 [JP] Japan .................................. 9-156383

[51] Int. Cl.[7] .................................................. H01L 27/10
[52] U.S. Cl. .......................... 257/202; 257/211; 257/355; 257/758
[58] Field of Search ..................... 257/355, 356, 257/357, 358, 359, 360, 361, 362, 363, 202, 203, 207, 208, 209, 210, 211, 758

[56] References Cited

U.S. PATENT DOCUMENTS

| | | | |
|---|---|---|---|
| 5,514,892 | 5/1996 | Countryman et al. | 257/355 |
| 5,734,200 | 3/1998 | Hsue et al. | 257/755 |
| 5,818,086 | 10/1998 | Lin et al. | 257/355 |
| 5,869,870 | 2/1999 | Lin | 257/355 |

FOREIGN PATENT DOCUMENTS 6-120426   4/1994   Japan .

*Primary Examiner*—Sara Crane
*Attorney, Agent, or Firm*—Beall Law Offices

[57] ABSTRACT

In a CMOS gate array, each of bonding pads corresponding to input cells for signals and bonding pads corresponding to input cells for supply voltages is formed of a plurality of conductor layers, whereas each of bonding pads (non-connected pads) corresponding to input/output cells not to be used is formed of, for example, the uppermost conductor layer. Thus, the bonding pad (non-connected pad) corresponding to the input/output cell not to be used becomes greater in the thickness of an underlying insulator film and longer in its spacing from a semiconductor substrate in comparison with each of the bonding pad for the signal and the bonding pad for the supply voltage.

20 Claims, 28 Drawing Sheets

SEMICONDUCTOR INTEGRATED CIRCUIT DEVICE

FIELD OF THE INVENTION

The present invention relates to a semiconductor integrated circuit device, and more particularly to technology which is effective when applied to a measure to counter the static damage of a logic LSI (Large-Scale Integrated Circuit) adopting a master slice method.

BACKGROUND OF THE INVENTION

A logic LSI which is manufactured by a master slice method, is a device wherein a desired logical function is realized in such a way that semiconductor elements, e. g., MISFETs (Metal Insulator Semiconductor Field Effect Transistors) constituting basic cells and I/O (input/output) cells are formed on a semiconductor substrate beforehand, and that the semiconductor elements are thereafter interconnected by wiring in accordance with logical specifications.

With such a logic LSI of the master slice method, predetermined numbers of bonding pads and underlying layers (semiconductor elements) for the I/O cells are manufactured on the semiconductor substrate beforehand irrespective of the number of pins which are to be actually used, and hence, pins which are not to be used arise in some logical specifications. In the ensuing description, such unused pins as are not connected to the internal circuits of the semiconductor substrate shall be called "NC (Non-Connected) pins".

SUMMARY OF THE INVENTION

In general, in this type of logic LSI based on the master slice method, a protective circuit is interposed between each input pin and a corresponding input circuit so as to absorb an overvoltage, as a countermeasure which prevents the insulator film or p-n junction of any internal circuit from breaking down due to static discharge. In addition, as stated below, that bonding pad not to be used (hereinbelow, termed "NC pad") which corresponds to an NC pin is constructed of the same structure as that of the bonding pad of an I/O cell.

The inventors' study, however, has revealed the following: Since a wiring line is not laid between the NC pad corresponding to the NC pin and the I/O cell, the protective circuit is not formed therebetween. Therefore, the NC pin is lower in the strength of static damage than the used pin which is connected to the protective circuit. By way of example, when electric charges have been accumulated in the NC pin by any cause after the completion of the assembling (packaging) step of a chip, the insulator film which isolates the NC pad from a semiconductor substrate directly underlying it incurs the static damage to short-circuit the NC pad and the substrate.

As a countermeasure for preventing such static damage of the NC pin, it is considered by way of example that a piece of wire is not bonded between the NC pin and the NC pad at the step of assembling a package, thereby to avoid the application of an overvoltage to the NC pad.

Besides, a countermeasure is considered wherein, as stated in the official gazette of Japanese Patent Application Laid-open No. 120426/1994, a protective diode circuit is also formed between the NC pad corresponding to the NC pin and an I/O cell not to be used, whereby the undesirable overvoltage applied to the NC pad is absorbed.

Of the above measures to counter the static damage of the NC pin, the countermeasure wherein the wire is not bonded between the NC pin and the NC pad at the step of assembling the package results in that the pieces of wire are not bonded to the NC pads existing in those places of the semiconductor chip which differ in accordance with logical specifications. Therefore, the wire bonding step becomes very complicated to pose the problem that the throughput of the manufacture of the logic LSI lowers.

On the other hand, the countermeasure wherein the protective circuit is also formed between the NC pad and the unused I/O cell results in that the NC pins which ought not to be connected to the internal circuits of the semiconductor substrate come to have diode characteristics. Therefore, the NC pins depart from their definition and also form the causes of malfunctions.

An object of the present invention is to provide techniques capable of enhancing the static damage strength of NC pins, in a logic LSI which adopts a master slice method.

The above and other objects and novel features of the present invention will become apparent from the description of this specification when read in conjunction with the accompanying drawings.

Typical aspects of performance of the present invention are briefly outlined as follows:

(1) The semiconductor integrated circuit device of the present invention comprises a logic integrated circuit of master slice method in which semiconductor elements are fabricated on the principal surface of a semiconductor substrate beforehand and are thereafter interconnected by at least two layers of wiring in accordance with logical specifications, thereby to realize a desired logical function, and in which each of bonding pads corresponding to I/O cells other than I/O cells not to be used in accordance with the logical specifications is formed of a plurality of conductor layers, and each of bonding pads corresponding to the I/O cells not to be used is formed of conductor layers that include the same conductor layer as the uppermost layer of wiring and that are smaller in number than the plurality of conductor layers of each of the bonding pads corresponding to the I/O cells other than the I/O cells not to be used.

(2) The semiconductor integrated circuit device of the present invention is such that at least the input cell for a supply voltage in the logic integrated circuit, and the bonding pad corresponding thereto are electrically connected through the plurality of layers of wiring.

(3) The semiconductor integrated circuit device of the present invention is such that an input protection circuit is formed at a stage preceding each of the I/O cells other than the I/O cells not to be used, and that it is not formed at a stage preceding each of the I/O cells not to be used.

(4) The semiconductor integrated circuit device of the present invention is such that each of the bonding pads corresponding to the I/O cells not to be used is formed only of the same conductor layer as the uppermost layer of wiring.

(5) The semiconductor integrated circuit device of the present invention is such that three layers of wiring are laid, that each of the bonding pads corresponding to the I/O cells not to be used is formed only of the same conductor layer as the third layer of wiring, and that each of the bonding pads corresponding to the I/O cells other than the I/O cells not to be used is formed of the three layers of conductor layers.

(6) The semiconductor integrated circuit device of the present invention is such that the logic integrated circuit is constructed including either a gate array or a microcomputer which has a gate array.

(7) The semiconductor integrated circuit device of the present invention comprises a package in which a semiconductor chip formed with an integrated circuit including the logic integrated circuit are electrically connected with leads through pieces of wire, the pieces of wire being connected to all of the bonding pads which include the bonding pads corresponding to the I/O cells not to be used.

(8) The semiconductor integrated circuit device of the present invention comprises a package in which a semiconductor chip formed with an integrated circuit including the logic integrated circuit are electrically connected with leads through bump electrodes, the leads being connected to all of the bonding pads which include the bonding pads corresponding to the I/O cells not to be used.

DESCRIPTION OF THE PREFERRED EMBODIMENTS

Now, the embodiments of the present invention will be described in detail with reference to the drawings. By the way, throughout the drawings for explaining the aspects of performance, the same symbols are assigned to constituents having the same functions, which shall be omitted from repeated description.

(Embodiment 1)

Figure 1:
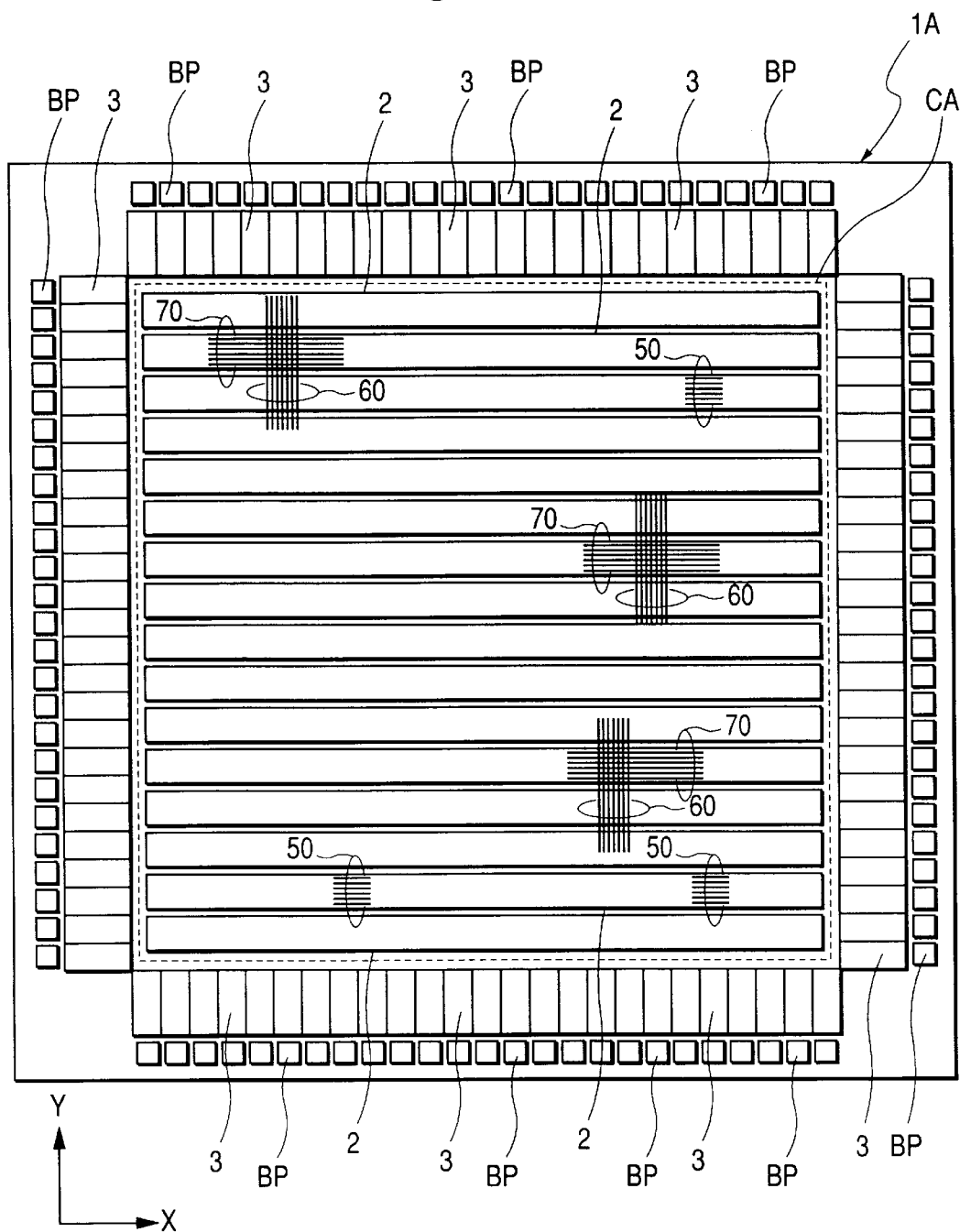
FIG. 1 is a whole plan view of a semiconductor chip which is formed with a CMOS gate array in one aspect of performance of the present invention.

A semiconductor integrated circuit device in this embodiment is a CMOS (Complementary Metal Oxide Semiconductor) gate array. The whole plan view of a semiconductor chip formed with the CMOS gate array is illustrated in FIG. 1.

Figure 2:
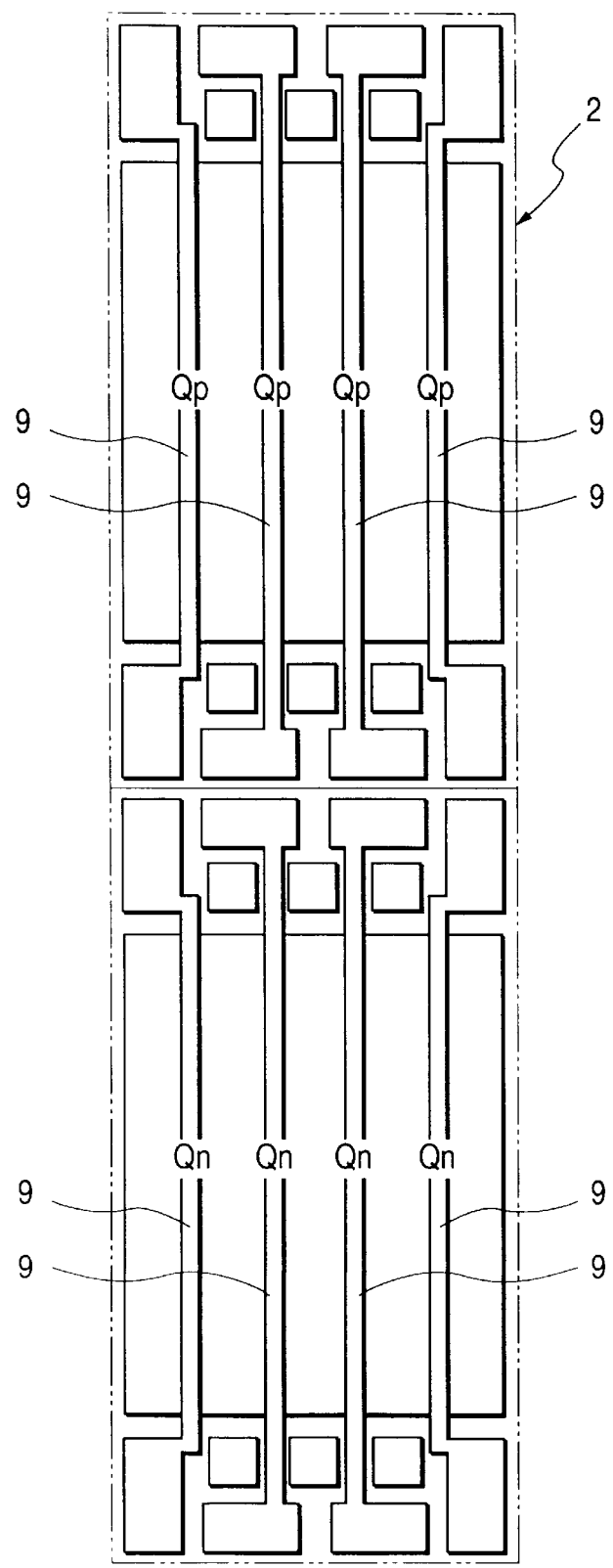
FIG. 2 is a plan view showing the basic cell of the CMOS gate array in the aspect of performance of the present invention.

An internal cell array CA which constructs the logic section of the gate array is formed centrally of the principal surface of the semiconductor chip 1A made of single-crystal silicon. The internal cell array CA includes a large number of basic cells 2 which are arrayed in the shape of a matrix in an X (lateral) direction and a Y (vertical) direction. As illustrated in FIG. 2, each of the basic cells 2 includes a predetermined number of n-channel type MISFETs Qn and p-channel type MISFETs Qp the gate electrodes 9 of which are unidirectionally arrayed. The MISFETs in each basic cell 2, and the basic cells 2 themselves are connected on the basis of logical specifications by the use of a first layer of wiring, a second layer of wiring and a third layer of wiring to be explained later, whereby a desired logical function is realized.

A plurality of I/O cells 3 are arranged around the internal cell array CA so as to surround this internal cell array CA. Likewise to the basic cell 2, each of the I/O cells 3 is constructed by combining n-channel type MISFETs and p-channel type MISFETs in predetermined numbers. The connection patterns among the first to third layers of wiring are changed on the basis of the logical specifications, thereby to realize various input/output circuit functions such as of input cells, output cells, bidirectional cells, I/O cells not to be used in accordance with the logical specifications, and I/O cells for supply voltages.

Bonding pads (external connection terminals) BP for establishing electrical connections with external devices are arranged around the I/O cells 3, that is, at the peripheral part of the semiconductor chip 1A. The bonding pads BP are situated at positions corresponding to the array of the I/O cells 3, and are electrically connected with the corresponding I/O cells 3 through lead-out wiring to be explained later.

Although not especially restricted, the CMOS gate array in this aspect of performance has the semiconductor chip 1A overlaid with the three layers of wiring lines (metal wiring lines) which are made of aluminum (Al) alloy films. Among these wiring lines, the first layer of wiring lines (50) and the second layer of wiring lines (60) chiefly form signal wiring lines, and the third layer of wiring lines (70) chiefly form supply voltage wiring lines (Vcc and GND). The connection patterns of these wiring lines are generated by, for example, an automatic placement and routing system employing CAD (Computer Aided Design). The first layer of wiring lines, the second layer of wiring lines and the third layer of wiring lines are laid out so as to extend in the X direction, in the Y direction and in the X direction, respectively.

Figure 3:
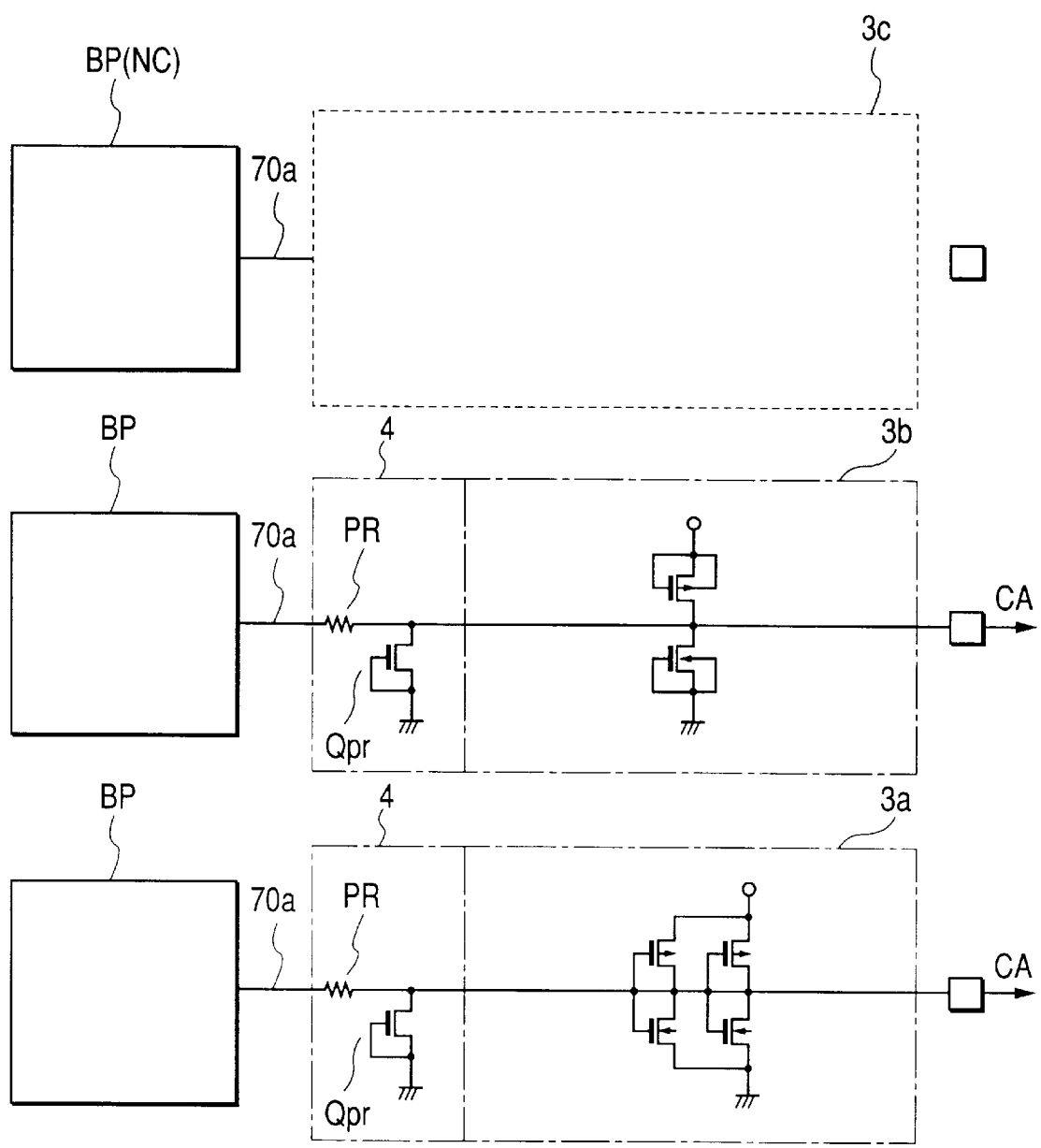
FIG. 3 is a plan view showing on an enlarged scale, part of a region where the I/O cells of the CMOS gate array in the aspect of performance of the present invention are formed.

FIG. 3 is a plan view showing on an enlarged scale, part of a region where the I/O cells 3 are formed. Symbol 3a in the figure denotes an input cell for a signal, symbol 3b an input cell for a supply voltage (Vcc or GND), and symbol 3c an I/O cell which is defined as non-connected in accordance with the logical specifications.

The input cell 3a for the signal includes, for example, two stages of CMOS inverters, and it is preceded by an input protection circuit 4 which includes, for example, a protective resistor PR and a clamp MISFET Qpr. The signal inputted from the bonding pad BP is transmitted to the input protection circuit 4 through the lead-out wiring line 70a, and is subsequently transmitted to the internal cell array CA via the input cell 3a. Owing to the provision of the input protection circuit 4 at the stage preceding the input cell 3a, the breakdown of an insulator film and that of a p-n junction in the input cell 3a and the internal cell array CA are preventable even in a case where electric charges have been accumulated in a signal pin, not shown, connected to the bonding pad BP, by some cause. Apart from the construction including the protective resistor PR and the clamp MISFET Qpr, the input protection circuit 4 may well include, for example, a diode with or without a protective resistor.

Figure 4:
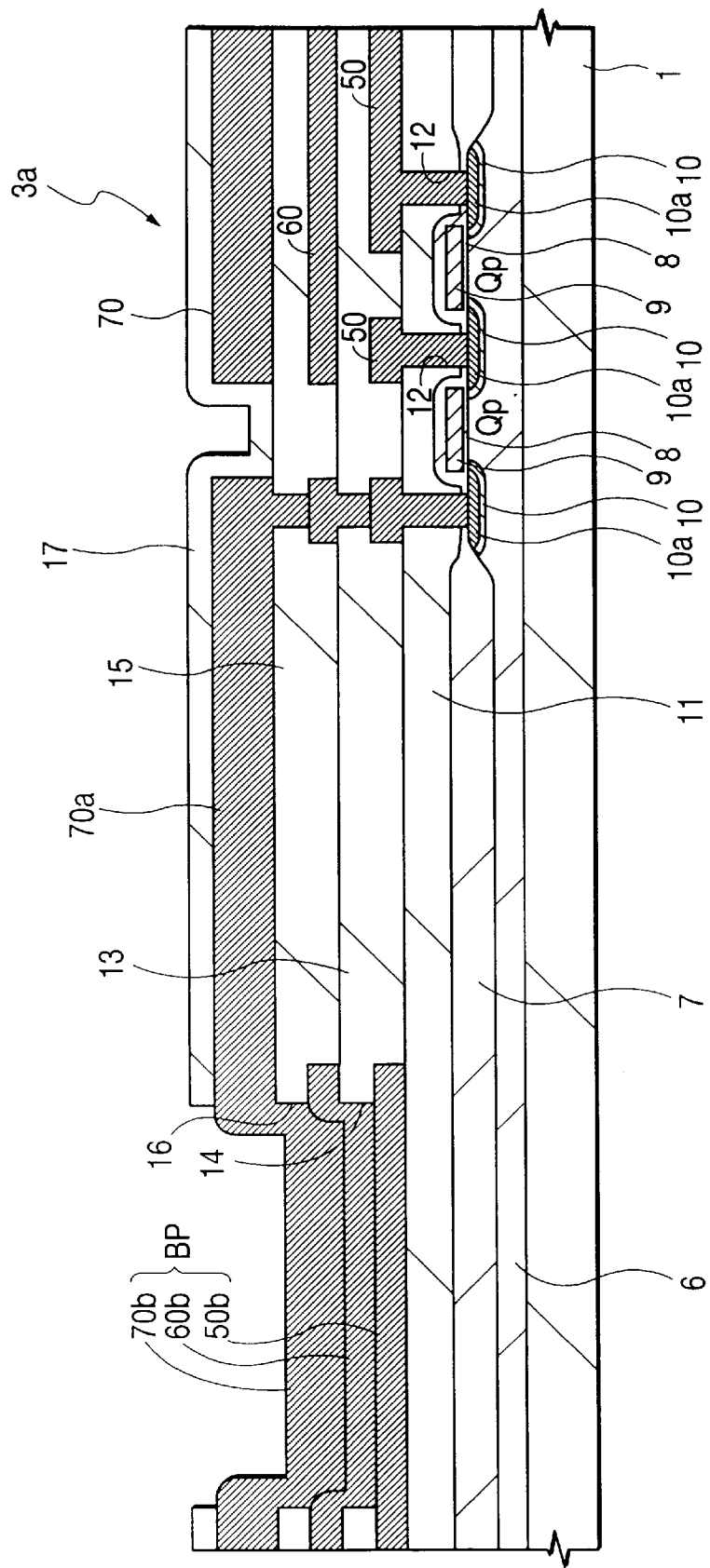
FIG. 4 is a sectional view showing a region where the signal input cell and the corresponding bonding pad of the CMOS gate array in the aspect of performance of the present invention are formed.

FIG. 4 is a sectional view of the semiconductor chip 1A showing a region where the input cell 3a for the signal and the bonding pad BP corresponding thereto are formed. Incidentally, the illustration of the input protection circuit 4 formed at the stage preceding the input cell 3a is omitted from the figure. Besides, the input cell 3a has only its part (p-channel type MISFETs Qp) illustrated.

An n-type well 6 is formed in the principal surface of a semiconductor substrate 1 which is made of single-crystal silicon of p-type. A field oxide film 7 is formed on the surface of the n-type well 6 in an element isolation region, and the p-channel type MISFETs Qp constituting the input cell 3a are formed in the n-type well 6 in an active region. Each of the p-channel type MISFETs Qp is chiefly configured of a gate oxide film (gate insulator film) 8, a gate electrode 9, a source (p-type semiconductor region 10) and a drain (p-type semiconductor region 10). The gate electrode 9 is made of, for example, a polycrystalline silicon film, a poly-cide film in which a film of refractory metal silicide such as tungsten silicide (WSi) is stacked on a polycrystalline silicon film, or a silicide film which is obtained by silicidizing a silicon film. In addition, the surface of each of the source and the drain is formed with a silicide (e. g., TiSi) layer which is obtained by silicidizing the substrate surface with Ti (titanium) or the like.

The p-channel type MISFET Qp is overlaid with a silicon oxide film 11, which is further overlaid with the first layer of wiring 50, and a first conductor layer 50b constituting the bonding pad BP. The first layer of wiring 50 is electrically connected with the p-type semiconductor region 10 of the p-channel type MISFET Qp through a contact hole 12 which is provided in the silicon oxide film 11.

The first layer of wiring 50 is overlaid with a first interlayer insulator film 13 made of a silicon oxide film or the like, which is further overlaid with the second layer of wiring 60, and a second conductor layer 60b constituting the bonding pad BP. The second conductor layer 60b is electrically connected with the first conductor layer 50b through a through hole 14 which is provided in the first interlayer insulator film 13.

The second layer of wiring 60 is overlaid with a second interlayer insulator film 15 made of a silicon oxide film or the like, which is further overlaid with the third layer of wiring 70, a third conductor layer 70b constituting the bonding pad BP, and the lead-out wiring line 70a for the electrical connection between the bonding pad BP and the input cell 3a. The third conductor layer 70b is electrically connected with the second conductor layer 60b through a through hole 16 which is provided in the second interlayer insulator film 15.

The uppermost part of the semiconductor substrate 1 except the surface of the bonding pad BP is formed with a passivation film (surface protection film) 17 which is made of, for example, a stacked film including a silicon oxide film and a silicon nitride film.

In this manner, with the CMOS gate array in this aspect of performance, the bonding pad BP corresponding to the input cell 3a for the signal is constituted by the three conductor layers (50b, 60b, 70b), and the bonding pad BP and the input cell 3a are electrically connected through the lead-out wiring line 70a which is of the same layer as the third layer of wiring 70.

As illustrated in FIG. 3, likewise to the input cell 3a for the signal, the input cell 3b for the supply voltage includes CMOSFETs, and it is preceded by an input protection circuit 4. The supply voltage (Vcc or GND) inputted from the bonding pad BP is transmitted to the input protection circuit 4 through a lead-out wiring line 70a, and is subsequently fed to the internal cell array CA via the input cell 3b. Owing to the provision of the input protection circuit 4 at the stage preceding the input cell 3b, the breakdown of an insulator film and that of a p-n junction in the input cell 3b and the internal cell array CA are preventable even in a case where electric charges have been accumulated in a supply voltage pin, not shown, connected to the bonding pad BP, by some cause.

Figure 5:
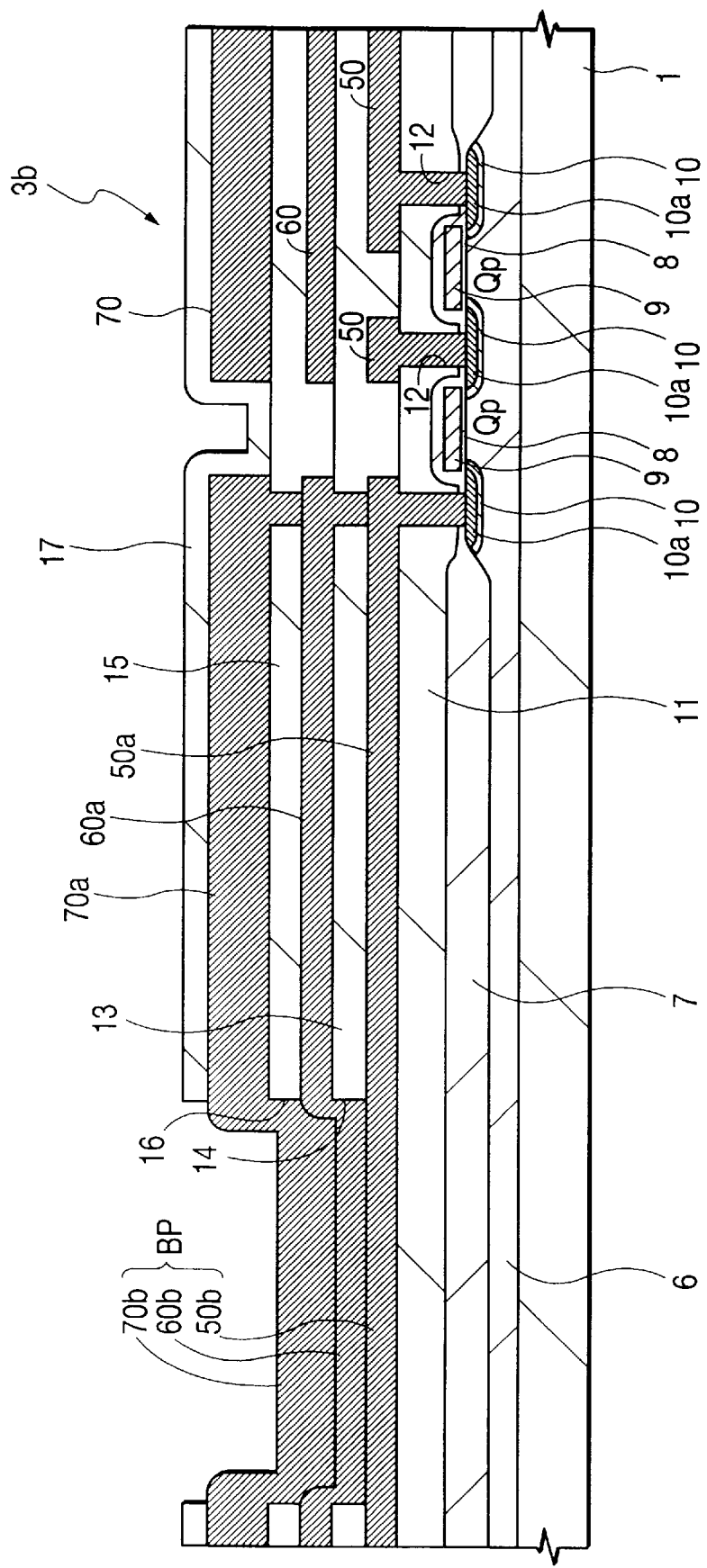
FIG. 5 is a sectional view showing a region where the supply voltage input cell and the corresponding bonding pad of the CMOS gate array in the aspect of performance of the present invention are formed.

FIG. 5 is a sectional view of the semiconductor chip 1A showing a region where the input cell 3b for the supply voltage and the bonding pad BP corresponding thereto are formed. Incidentally, the illustration of the input protection circuit 4 formed at the stage preceding the input cell 3*b* is omitted from the figure. Besides, the input cell 3*b* has only its part (p-channel type MISFETs Qp) illustrated.

The p-channel type MISFET Qp constituting the input cell 3*b* is overlaid with a silicon oxide film 11, which is further overlaid with the first layer of wiring 50, a first conductor layer 50*b* constituting the bonding pad BP, and a lead-out wiring line 50*a* for the electrical connection between the bonding pad BP and the input cell 3*b*.

The first layer of wiring 50 is overlaid with a first interlayer insulator film 13, which is further overlaid with the second layer of wiring 60, a second conductor layer 60*b* constituting the bonding pad BP, and a lead-out wiring line 60*a* for the electrical connection between the bonding pad BP and the input cell 3*b*. The second conductor layer 60*b* is electrically connected with the first conductor layer 50*b* through a through hole 14 which is provided in the first interlayer insulator film 13.

The second layer of wiring 60 is overlaid with a second interlayer insulator film 15, which is further overlaid with the third layer of wiring 70, a third conductor layer 70*b* constituting the bonding pad BP, and the lead-out wiring line 70*a* for the electrical connection between the bonding pad BP and the third layer of wiring 70. The third conductor layer 70*b* is electrically connected with the second conductor layer 60*b* through a through hole 16 which is provided in the second interlayer insulator film 15.

In this manner, with the CMOS gate array in this embodiment, the bonding pad BP corresponding to the input cell 3*b* for the supply voltage is constituted by the three conductor layers (50*b*, 60*b*, 70*b*). Besides, the bonding pad BP and the input cell 3*b* which are used for the supply voltage are electrically connected through the three layers of lead-out wiring (50*a*, 60*a*, 70*a*), thereby to enhance the electromigration resistance of the lead-out wiring lines (50*a*, 60*a*, 70*a*) through which large currents flow.

Figure 6:
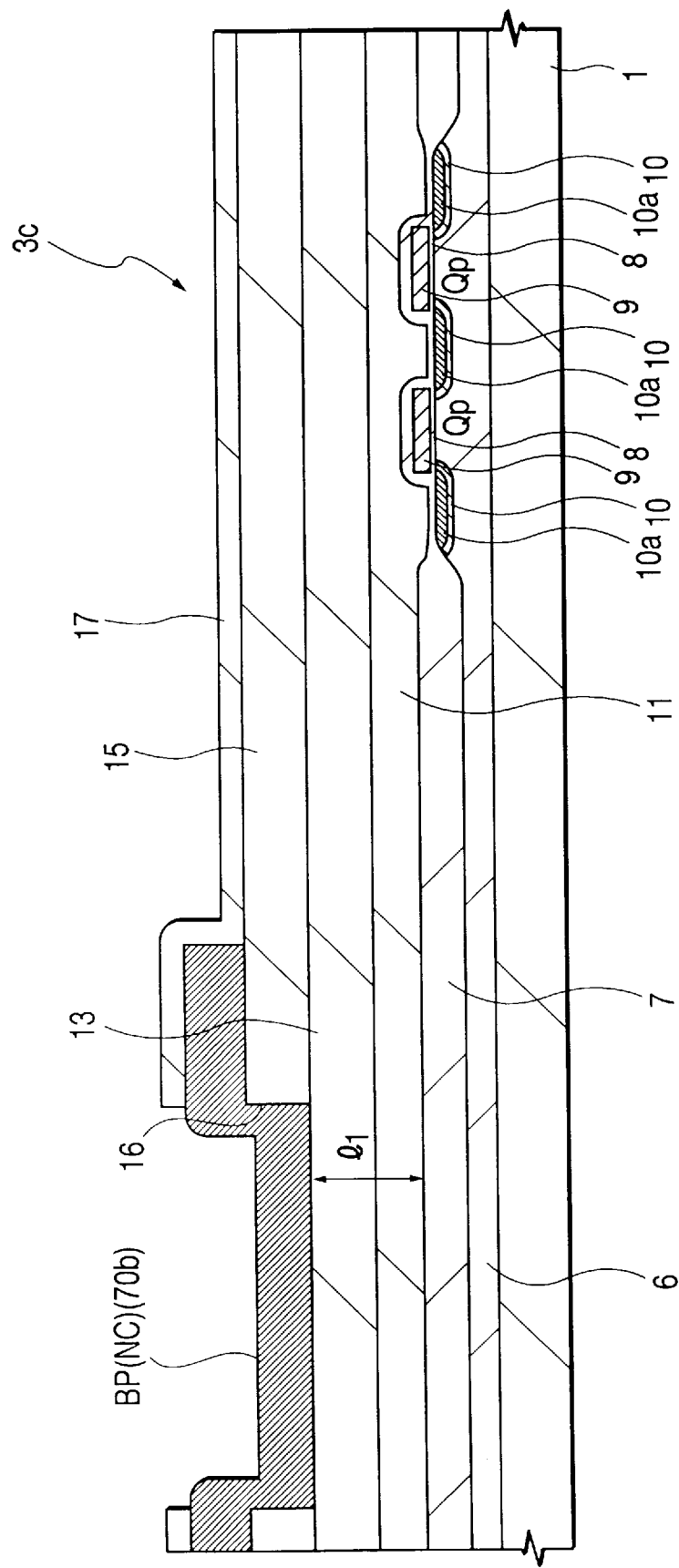
FIG. 6 is a sectional view showing a region where the non-connected I/O cell and the corresponding bonding pad of the CMOS gate array in the aspect of performance of the present invention are formed.

FIG. 6 is a sectional view of the semiconductor chip 1A showing a region where the non-connected I/O cell 3*c* and the bonding pad (NC pad) BP corresponding thereto are formed.

As illustrated in the figure, the bonding pad (NC pad) BP corresponding to the I/O cell 3*c* is formed only of a third conductor layer 70*b* which is the same layer as the third layer of wiring 70. Also, the lead-out wiring line connected to the bonding pad (NC pad) BP is formed only of the lead-out wiring line 70*a* which is of the same layer as the third layer of wiring 70. Therefore, only the insulator films (field oxide film 7, silicon oxide film 11, first interlayer insulator film 13, and second interlayer insulator film 15) are existent between the third conductor layer 70*b* which forms the bonding pad (NC pad) BP and that part of a semiconductor substrate 1 which underlies the layer 70*b*, and any conductor layer is not existent therebetween.

In this manner, with the CMOS gate array in this embodiment, each of the bonding pad BP corresponding to the input cell 3*a* for the signal and the bonding pad BP corresponding to the input cell 3*b* for the supply voltage is constituted by the plurality of (three) conductor layers (50*b*, 60*b*, 70*b*), whereas the bonding pad (NC pad) BP corresponding to the non-connected I/O cell 3*c* is formed only of the uppermost conductor layer 70*b*.

Figure 28:
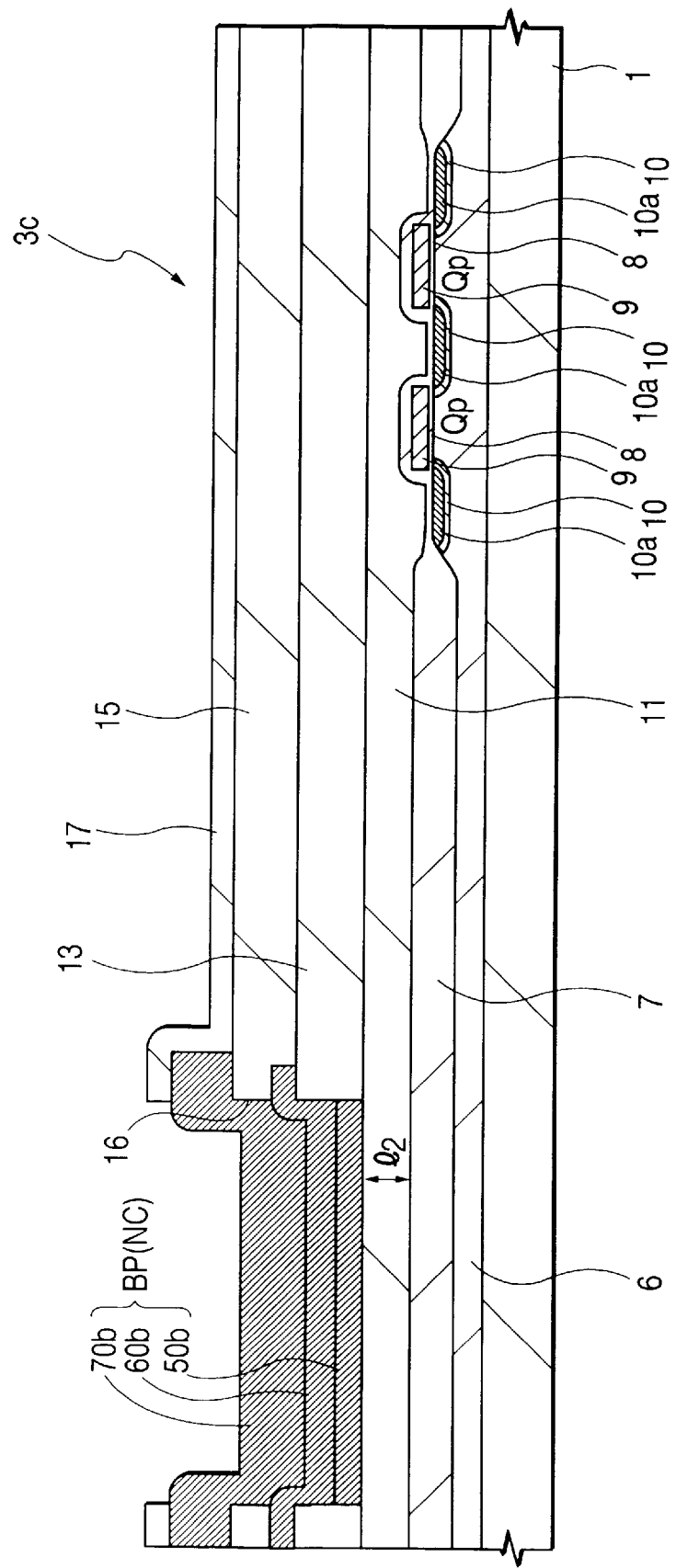
FIG. 28 is a sectional view showing a region where a non-connected I/O cell and a bonding pad corresponding thereto in a comparative example are formed.

Thus, the bonding pad (NC pad) BP corresponding to the non-connected I/O cell 3*c* is greater in the combined thickness ($l_1$) of the underlying insulator films and longer in its spacing from the semiconductor substrate 1 in comparison with each of the bonding pads BP for the signal and for the supply voltage as are constituted by the three conductor layers (50*b*, 60*b*, 70*b*). Therefore, even in the case where electric charges have been accumulated in the unshown NC pin connected to the bonding pad (NC pad) BP, by some cause, the static damage is less liable to occur in the insulator films which intervene between the bonding pad (NC pad) BP and the semiconductor substrate 1. On the other hand, in a case where, as illustrated in FIG. 28, the bonding pad (NC pad) BP corresponding to the non-connected I/O cell 3*c* is constituted by the three conductor layers (50*b*, 60*b*, 70*b*) likewise to each of the bonding pads BP for the signal and for the supply voltage, the thickness ($l_2$) of the underlying insulator film is smaller ($l_2 < l_1$), and hence, the static damage is more liable to occur in the insulator film which intervenes between the bonding pad (NC pad) BP and the semiconductor substrate 1.

Figure 7:
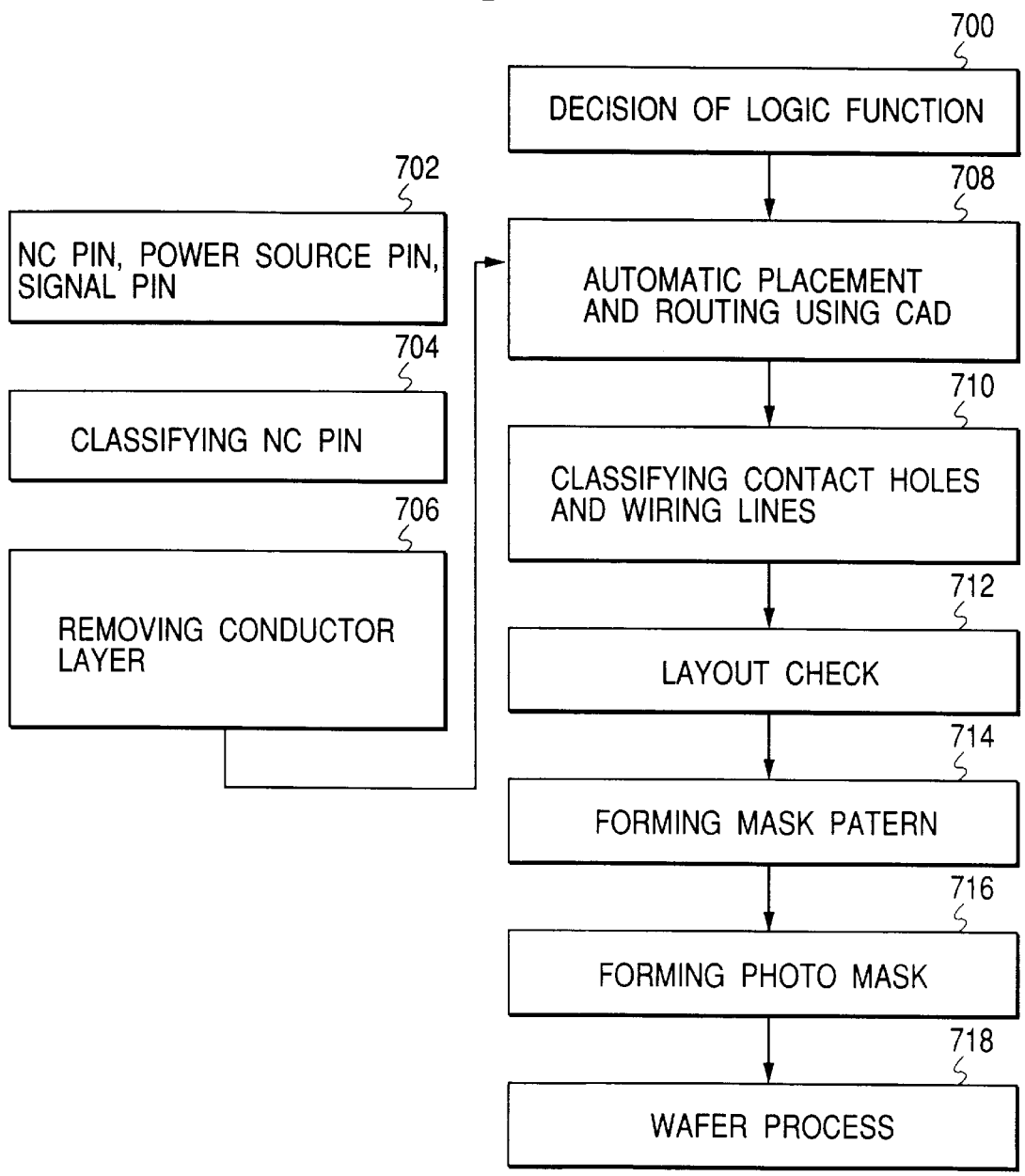
FIG. 7 is a flowchart of a wiring formation process which is based on an automatic placement and routing system employing CAD.

FIG. 7 is a flowchart of a wiring formation process which is based on an automatic placement and routing system (design automation abbreviated to "DA") employing CAD. The outline of the process will be briefly explained. First, a logic circuit constituting a gate array is designed and then subjected to a logical simulation for the verification of the operation of a logical function until the final logical function is determined (700).

Subsequently, wiring lines, connection holes, and conductor layers for bonding pads are automatically placed on X-Y lattice coordinates on the basis of the above logical function by the use of the CAD. At this time, NC pins are decided (704) on the basis of the information (702) of the NC pins, supply voltage pins and signal pins, and the conductor layers other than the uppermost one are removed (706) from NC pads.

Subsequently, the wiring lines and connection holes (708) automatically placed on the X-Y lattice coordinates are classified in three dimensions. That is, the first to third layers of wiring (50, 60, 70), the connection holes (contact holes 12, and through holes 14, 16) and the conductor layers (50*b*, 60*b*, 70*b*) are identified (710) on the program of the automatic placement and routing system.

Subsequently, any departure from layout rules as to connection patterns formed by the automatic placement step is checked (712). The check of the departure inspects whether or not the wiring lines can be laid according to the connection patterns without any problem mainly in a wafer process. In a case where the connection patterns have been decided defective by the check of the departure, they are altered, and the check of the departure is carried out again.

Subsequently, mask patterns are generated (714) on the basis of the information of the automatic placement and routing system. Thus far described is the outline of the wiring formation process based on the automatic placement and routing system (DA). Thereafter, a photo mask which is formed with the patterns of the first to third layers of wiring (50, 60, 70) and conductor layers (50*b*, 60*b*, 70*b*), and a photo mask which is formed with the patterns of the connection holes (contact holes 12, and through holes 14, 16), are fabricated (716) on the basis of the information of the above mask patterns and by the use of an electron-beam lithographic apparatus or the like. Using these photo masks, the first to third layers of wiring (50, 60, 70), connection holes (contact holes 12, and through holes 14, 16) and conductor layers (50*b*, 60*b*, 70*b*) are formed (718) on the semiconductor substrate.

Next, a process for manufacturing the CMOS gate array will be briefly described with reference to FIGS. 8 to 14.

Figure 8:
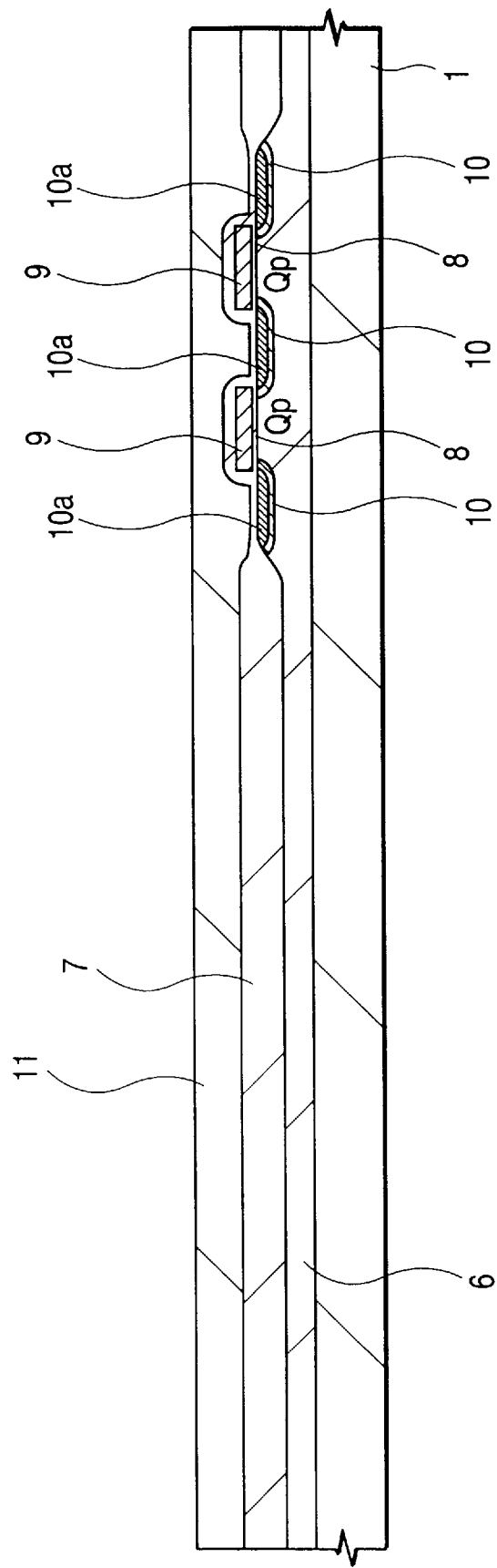
FIGS. 8 thru 14 are sectional views of the essential portions of a semiconductor substrate, each showing a method of manufacturing the CMOS gate array in the aspect of performance of the present invention.

First, as illustrated in FIG. 8, a semiconductor substrate 1 on which p-channel type MISFETs Qp and n-channel type MISFETS, not shown, have been formed in accordance with a known CMOS process beforehand is provided, and a silicon oxide film 11 is deposited over the MISFETs by CVD (chemical vapor deposition).

Figure 9:
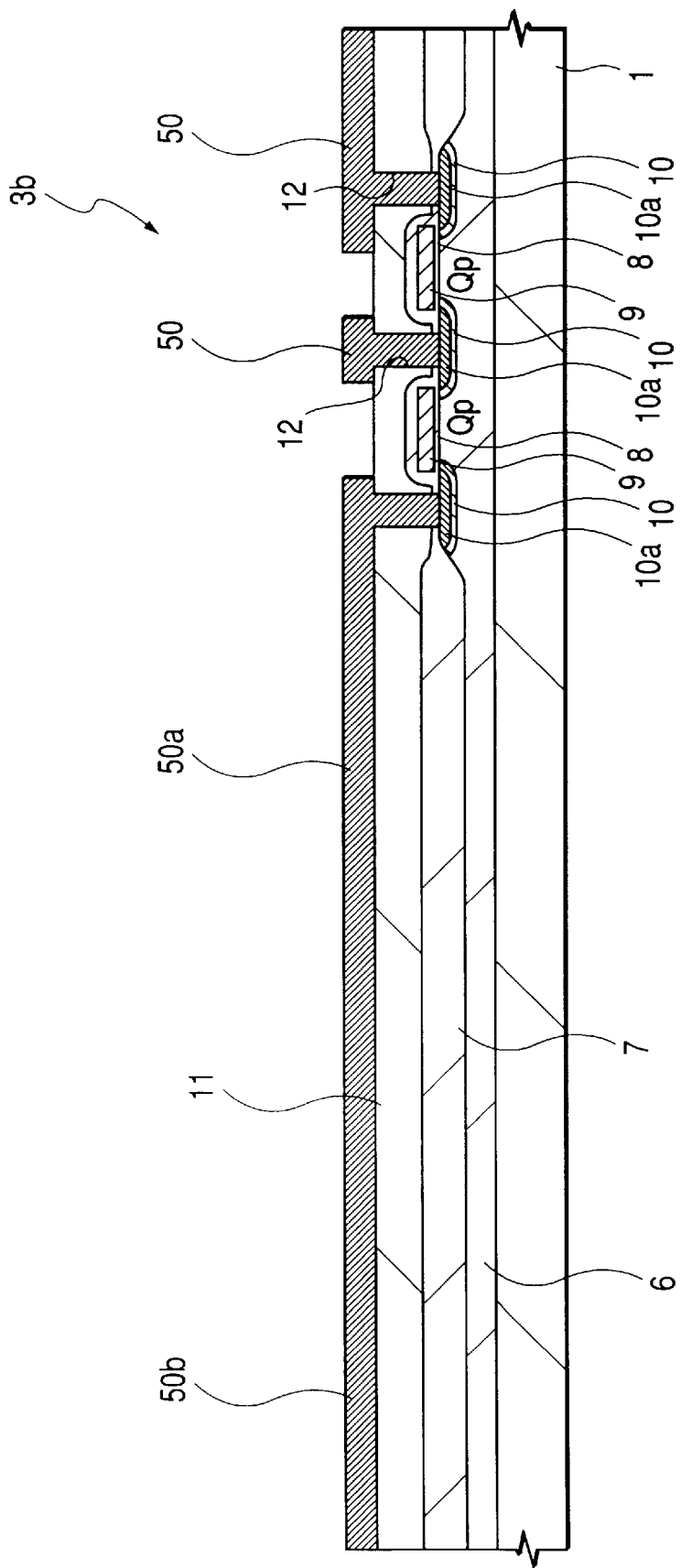
Figure 10:
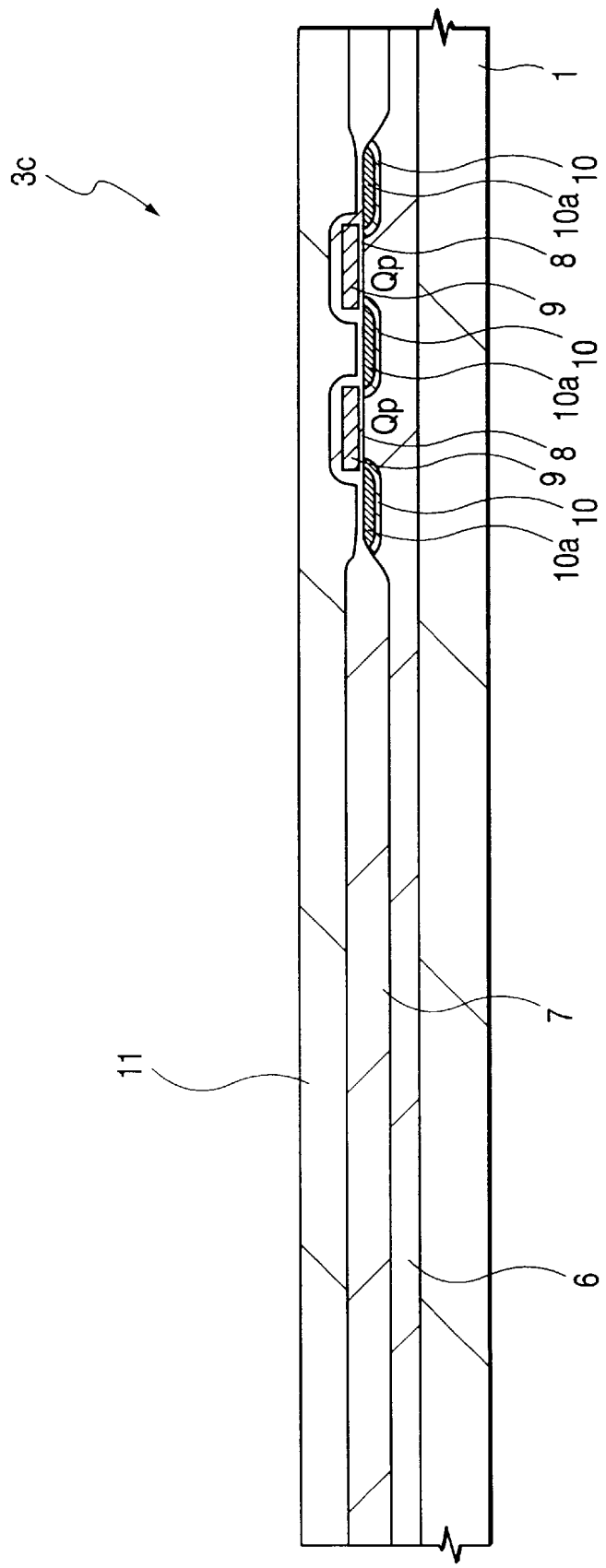

Subsequently, as illustrated in FIG. 9, contact holes 12 are formed in those parts of the silicon oxide film 11 which overlie each input cell 3b for a supply voltage, by etching which uses a photoresist as a mask. Thereafter, an Al (aluminum) alloy film is deposited on the silicon oxide film 11 by sputtering and is patterned. Thus, there are formed the first layer of wiring lines 50 of the input cell 3b, a first conductor layer 50b which constitutes each bonding pad BP, and a lead-out wiring line 50a which connects them. On this occasion, each input cell 3a for a signal, not shown, is overlaid with the first layer of wiring lines 50 of the input cell 3a, and the first conductor layer 50b constituting the bonding pad BP. In contrast, as illustrated in FIG. 10, none of the first layer of wiring lines 50, the first conductor layer 50b, and the lead-out wiring line 50a for connecting them are formed in a region where each I/O cell 3c not to be used is to be formed.

Figure 11:
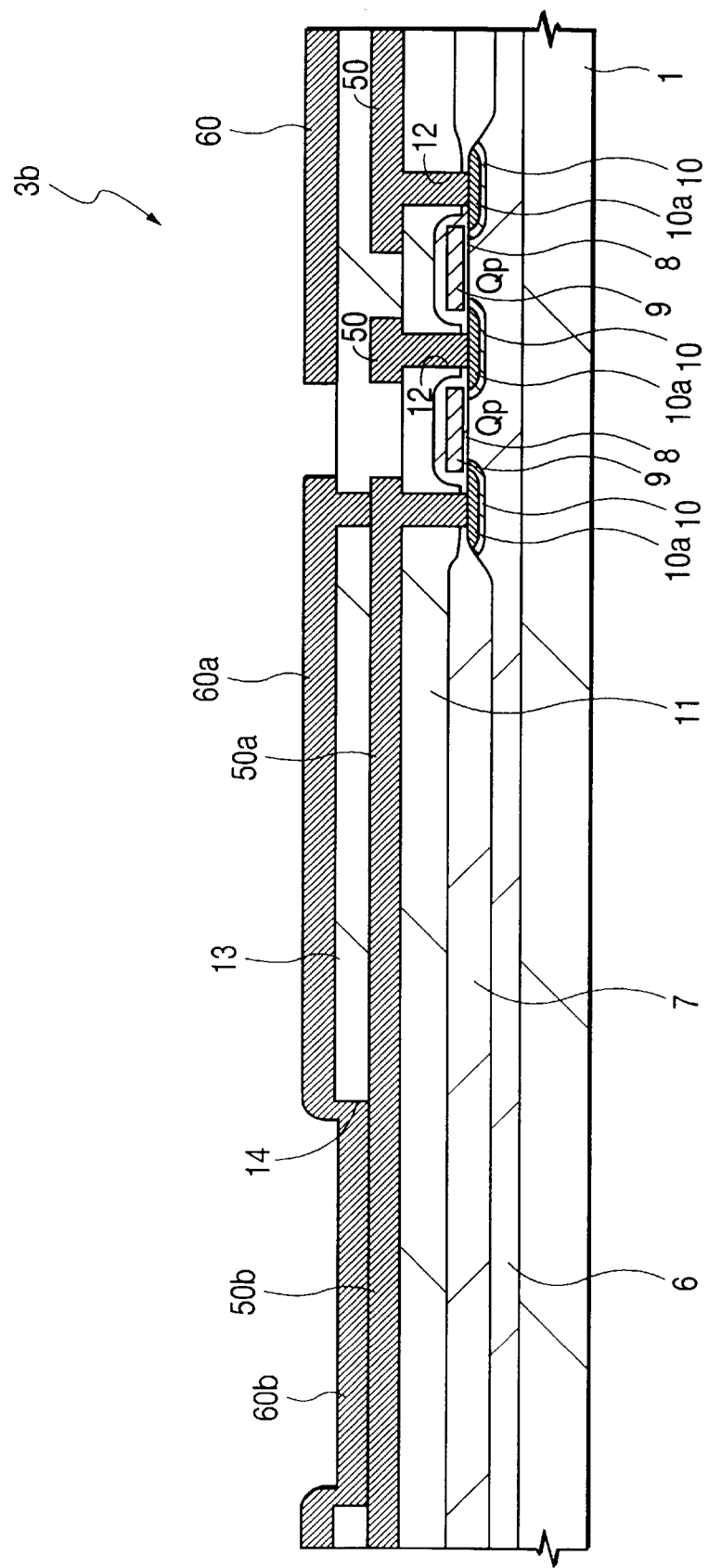
Figure 12:
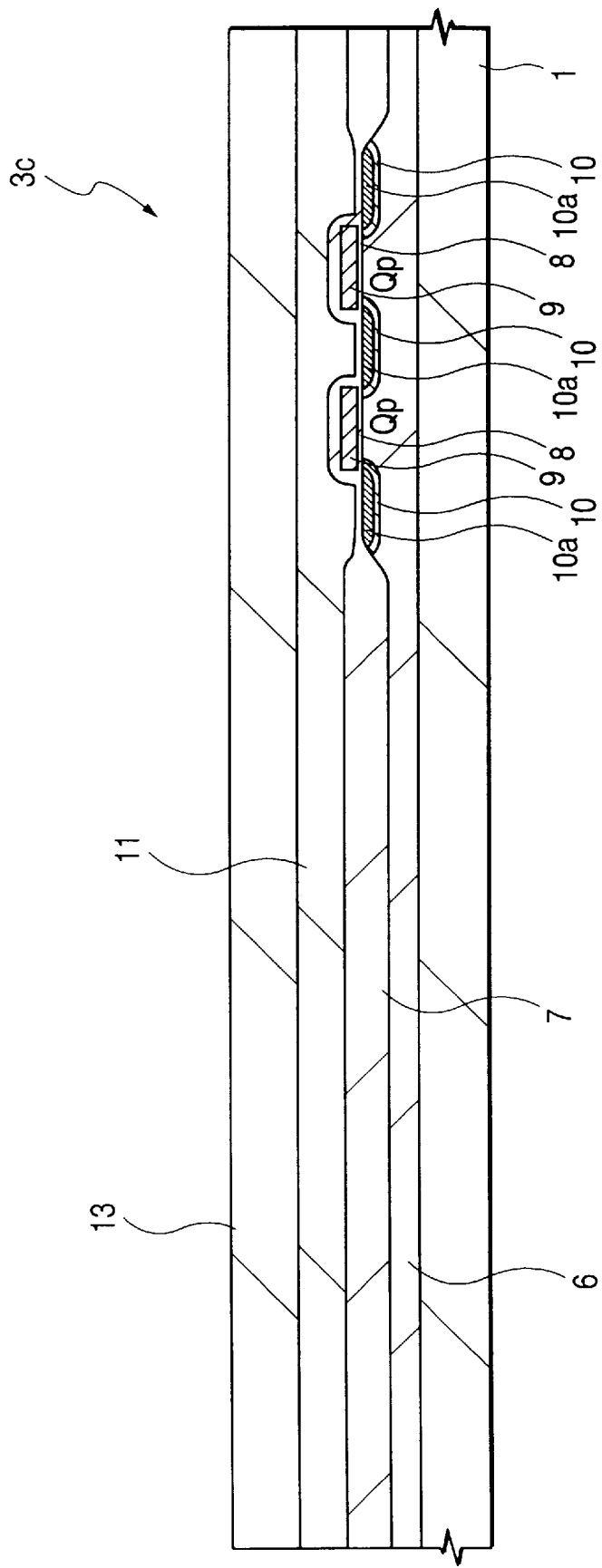

Subsequently, a first interlayer insulator film 13 made of a silicon oxide film is deposited on the semiconductor substrate 1 by CVD. Thereafter, as illustrated in FIG. 11, a through hole 14 is formed in that part of the first interlayer insulator film 13 which lies in a region where the bonding pad BP is to be formed, by etching which uses a photoresist as a mask. Thereafter, an Al alloy film is deposited on the first interlayer insulator film 13 by sputtering and is patterned. Thus, there are formed the second layer of wiring line 60 of the input cell 3b for the supply voltage, a second conductor layer 60b which constitutes the bonding pad BP, and a lead-out wiring line 60a which connects them. On this occasion, the input cell 3a for the signal, not shown, is overlaid with the second layer of wiring line 60 of the input cell 3a, and the second conductor layer 60b constituting the bonding pad BP. In contrast, as illustrated in FIG. 12, none of the second layer of wiring line 60, the second conductor layer 60b, and the lead-out wiring line 60a for connecting them are formed in the region where the I/O cell 3c not to be used is to be formed.

Figure 13:
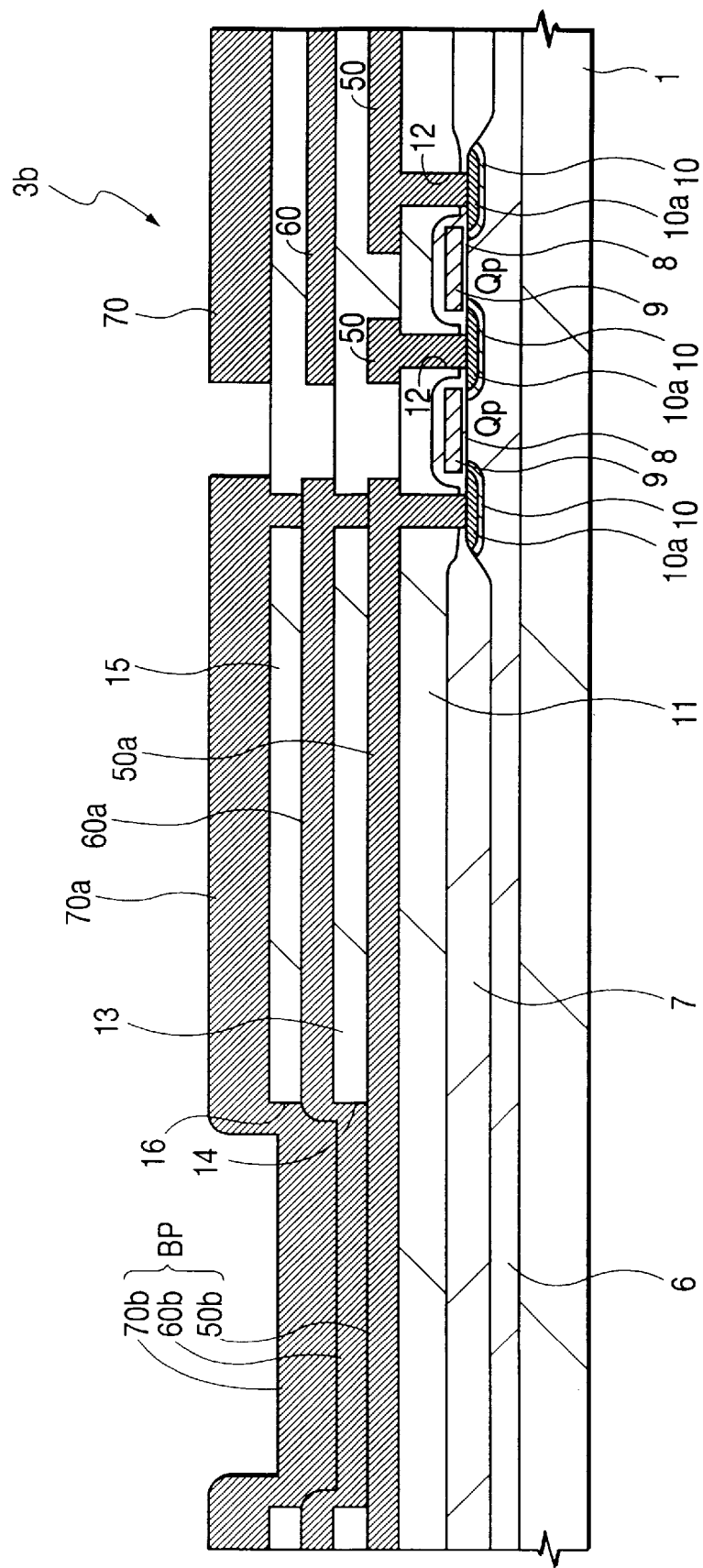
Figure 14:
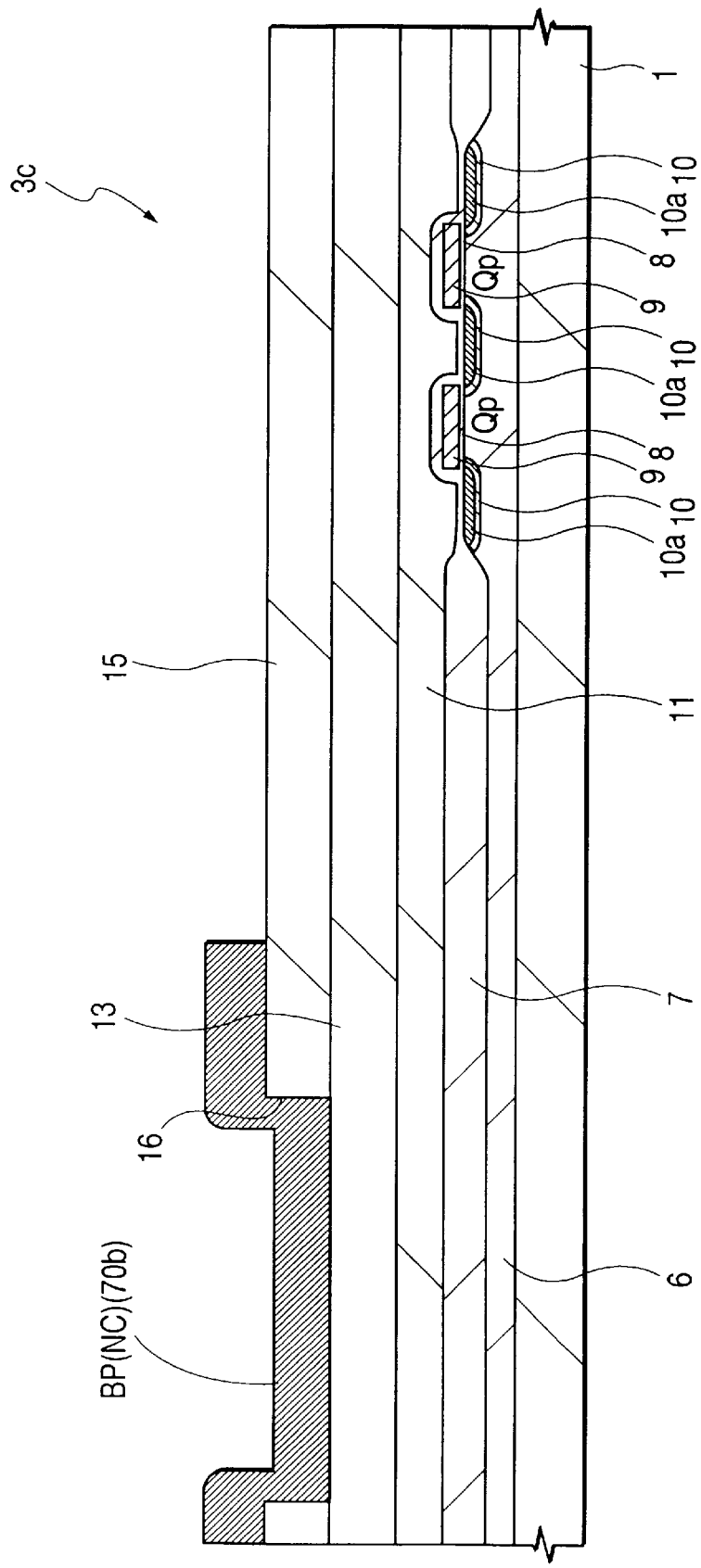

Subsequently, a second interlayer insulator film 15 made of a silicon oxide film is deposited on the semiconductor substrate 1 by CVD. Thereafter, as illustrated in FIG. 13, a through hole 16 is formed in that part of the second interlayer insulator film 15 which lies in the region where the bonding pad BP is to be formed, by etching which uses a photoresist as a mask. Thereafter, an Al alloy film is deposited on the second interlayer insulator film 15 by sputtering and is patterned. Thus, there are formed the third layer of wiring line 70 of the input cell 3b for the supply voltage, a third conductor layer 70b which constitutes the bonding pad BP, and a lead-out wiring line 70a which connects them. On this occasion, the input cell 3a for the signal, not shown, is overlaid with the third layer of wiring line 70 of the input cell 3a, and the third conductor layer 70b constituting the bonding pad BP. Besides, as illustrated in FIG. 14, the third conductor layer 70b constituting the bonding pad BP, and the lead-out wiring line 70a connected thereto are formed in the region where the I/O cell 3c not to be used is to be formed.

Figure 15:
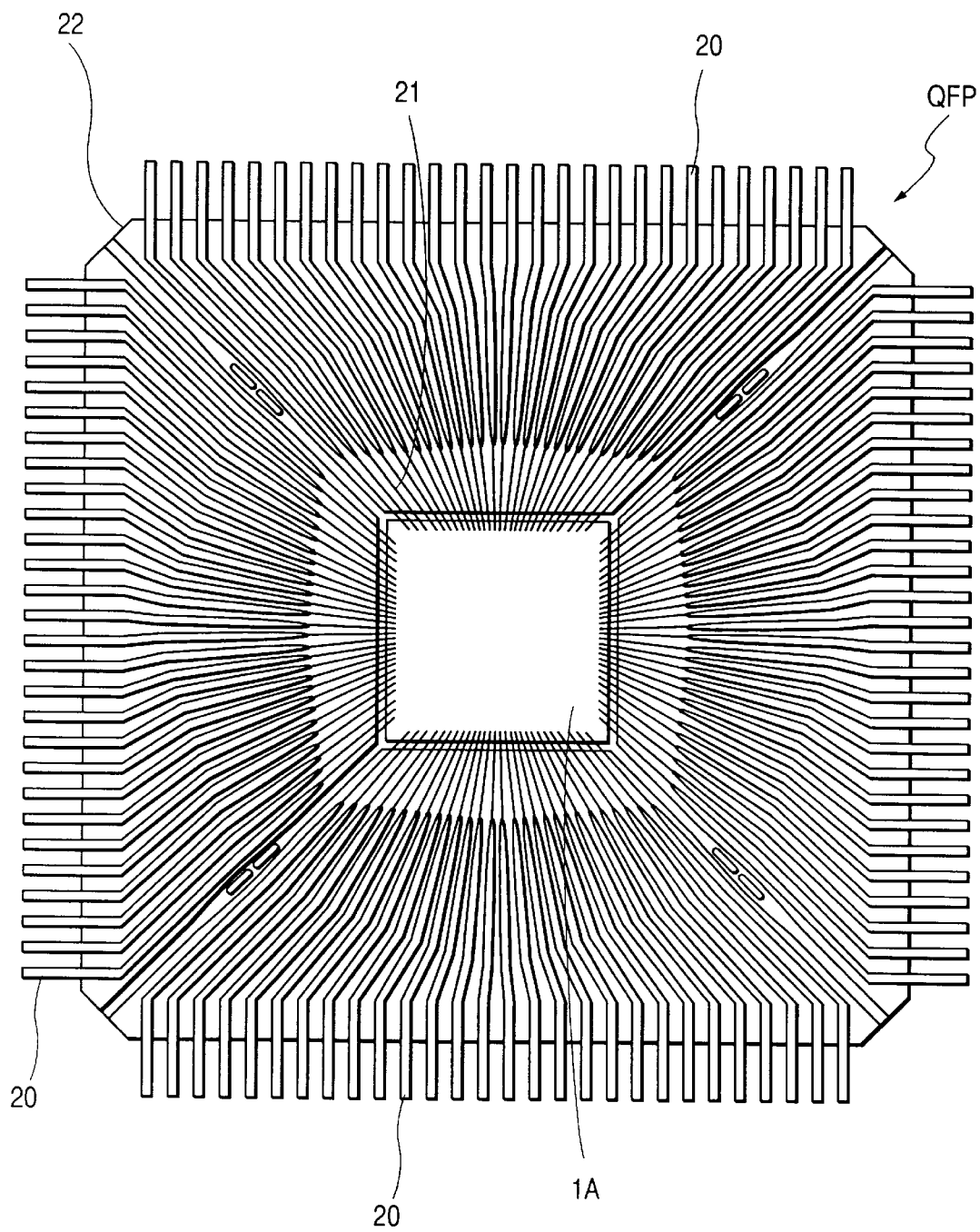
FIG. 15 is a schematic plan view of a QFP (Quad Flat Package) in which the semiconductor chip formed with the CMOS gate array in the aspect of performance of the present invention is encapsulated.
Figure 16:
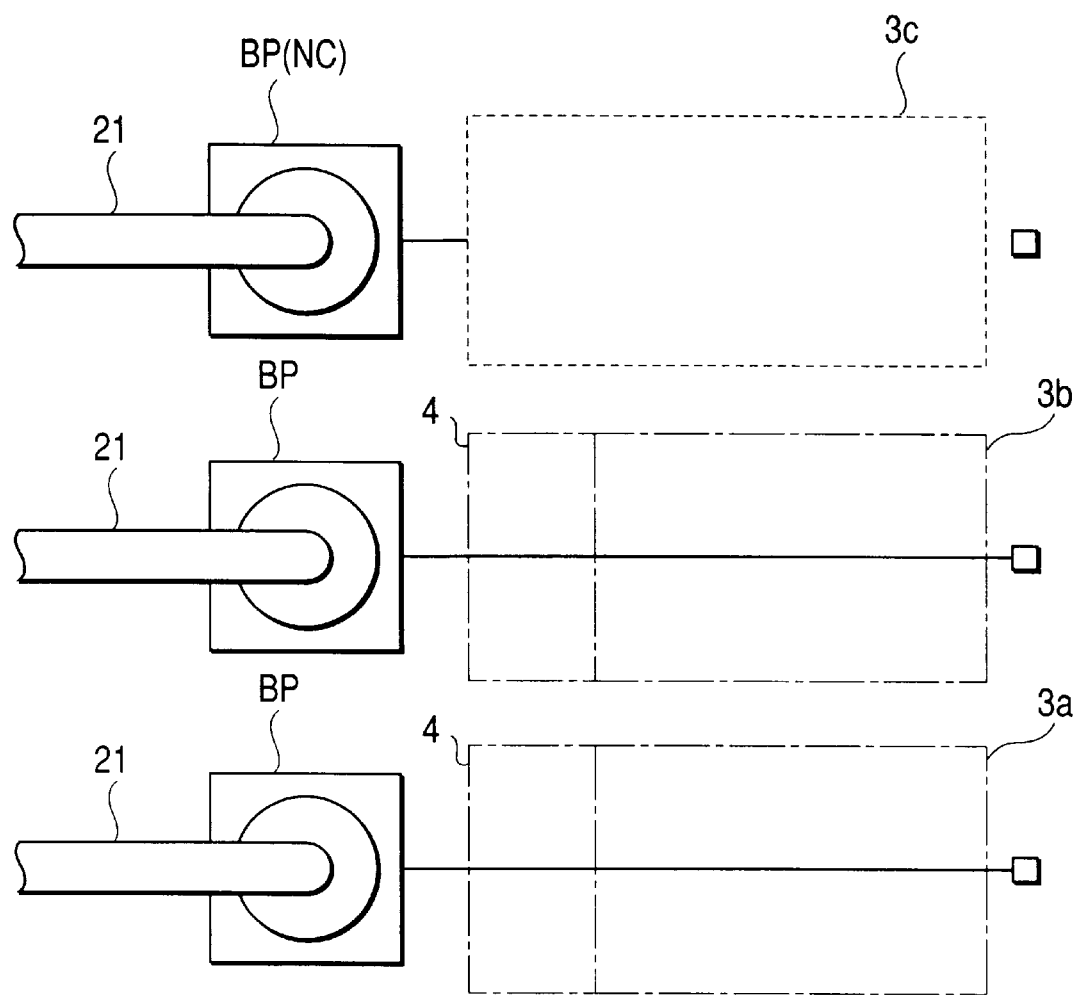
FIG. 16 is a plan view showing on an enlarged scale, part of a region where the bonding pads and I/O cells of the semiconductor chip encapsulated in the QFP depicted in FIG. 15 are formed.
Figure 17:
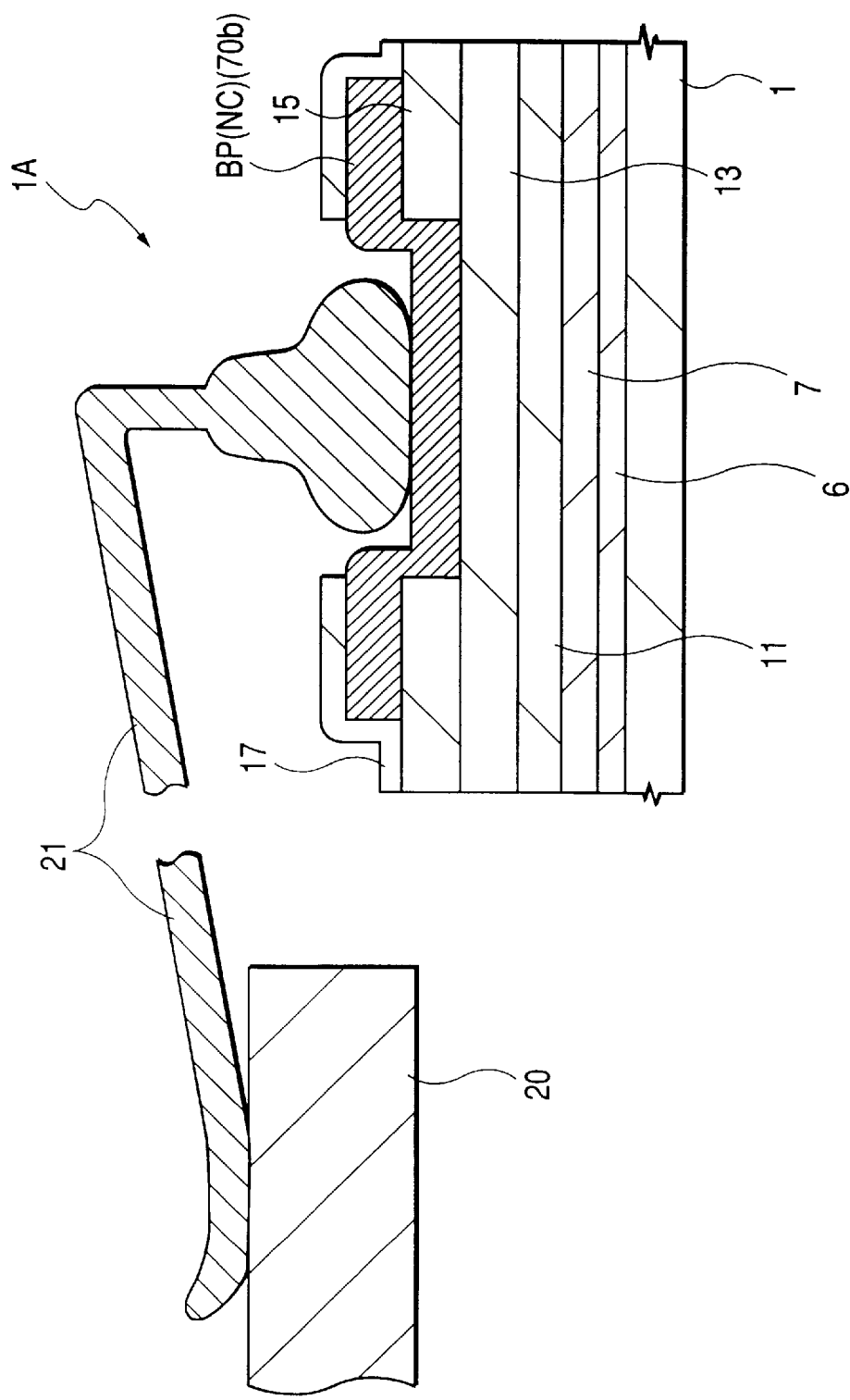
FIG. 17 is a sectional view showing on an enlarged scale, part of a region where the bonding pad and I/O cell of the semiconductor chip encapsulated in the QFP depicted in FIG. 15 are formed.

FIG. 15 is a schematic plan view of a QFP (Quad Flat Package) in which a semiconductor chip 1A formed with the CMOS gate array is encapsulated, FIG. 16 is a plan view showing on an enlarged scale, parts of regions where the bonding pads BP and I/O cells 3 of the semiconductor chip 1A encapsulated in the QFP are formed, and FIG. 17 is a sectional view of the semiconductor chip 1A showing the region where the NC pad BP is formed. Numeral 20 in the figures designates each lead which constructs the external connection terminal of the QFP, numeral 21 each piece of Au (gold) wire which electrically connects the lead 20 and the semiconductor chip 1A, and numeral 22 that package body of the QFP which is made of a synthetic resin.

As illustrated in the figures, the QFP is such that the pieces of Au wire 21 are bonded to all the bonding pads BP of the semiconductor chip 1A including the bonding pads (NC pads) BP correspondent to the I/O cells 3c not to be used. That is, the wire bonding is carried out without considering the positions of the bonding pads (NC pads) BP correspondent to the I/O cells 3a not-to-be-used which are arranged on the different places of the semiconductor chip 1A in accordance with logical specifications. In this way, the wire bonding steps of all the semiconductor chips 1A of different logical specifications can be made common, and hence, the throughput of the wire bonding step can be enhanced.

Figure 18:
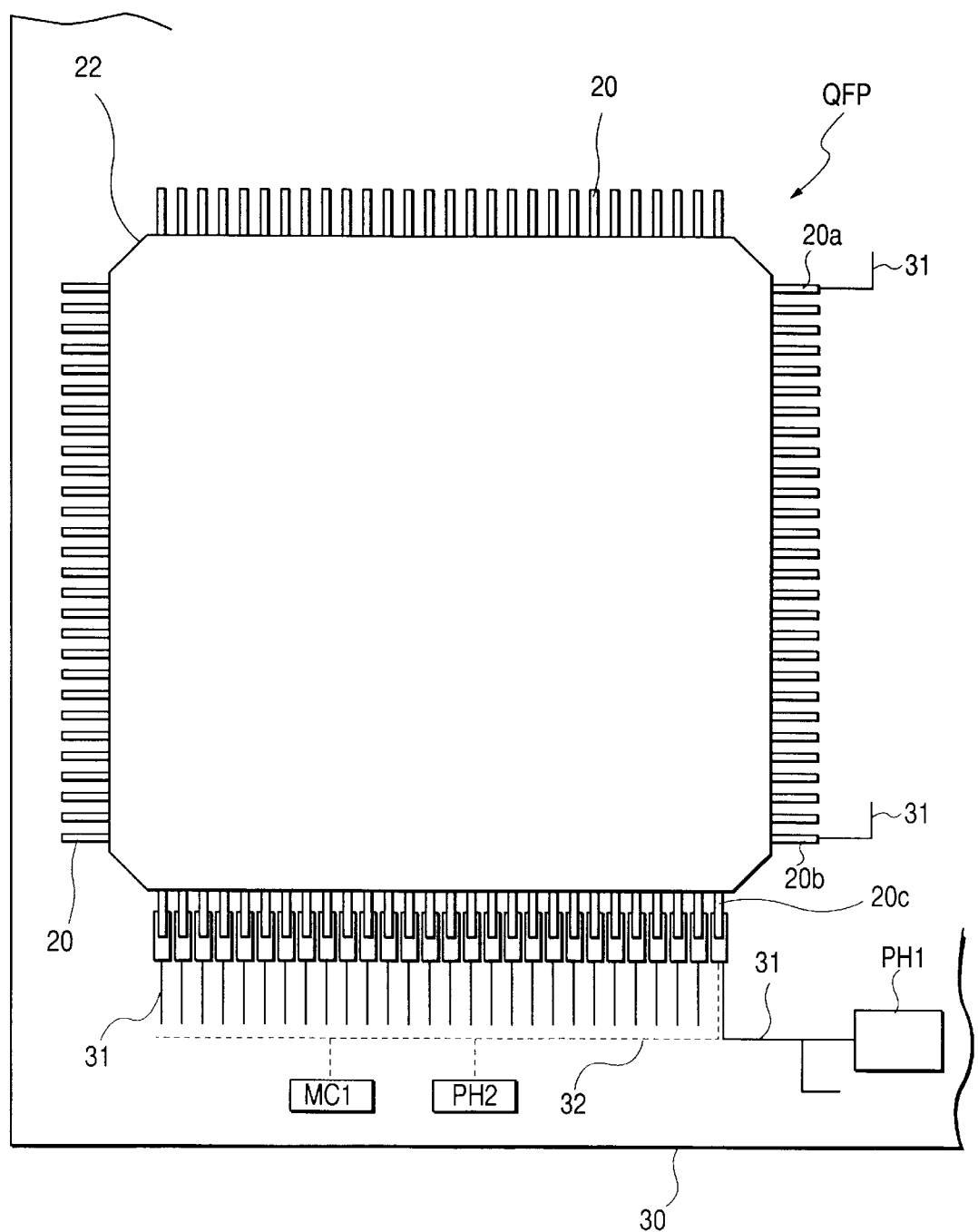
FIG. 18 is a plan view of the essential portions of a printed-wiring circuit board on which the QFP depicted in FIG. 15 is mounted.
Figure 19:
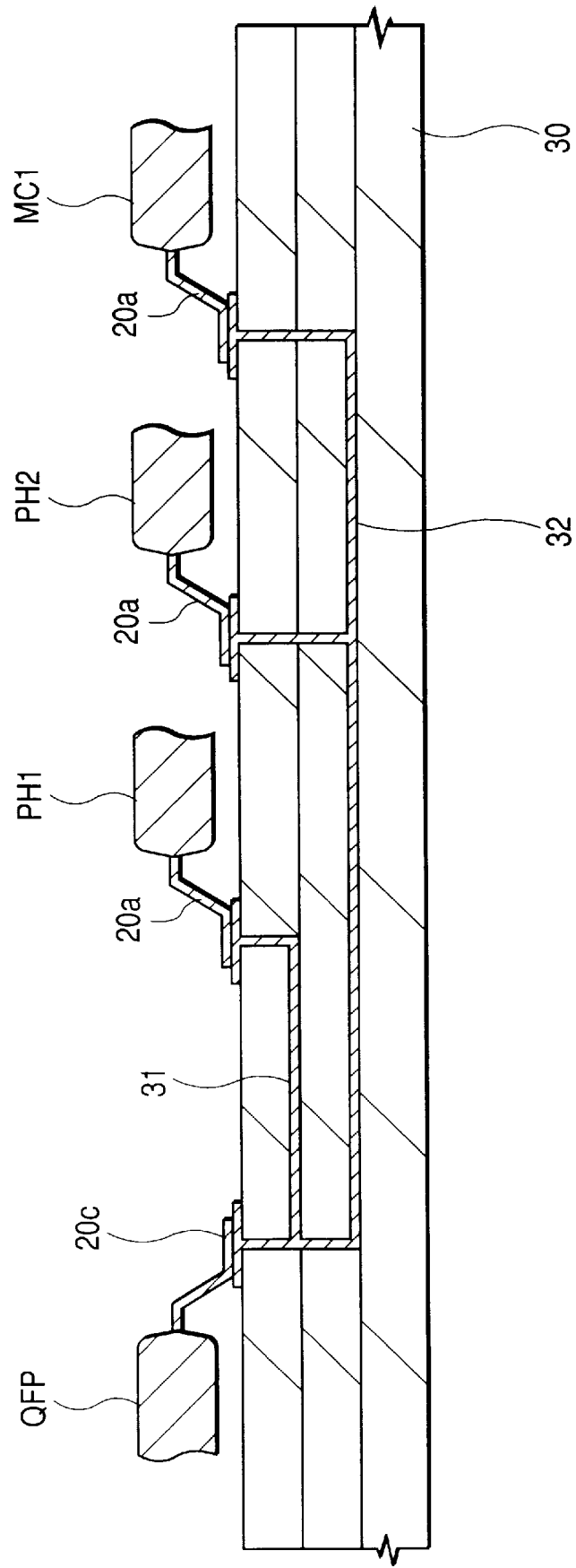
FIG. 19 is a sectional view of the essential portions of the printed-wiring circuit board on which the QFP depicted in FIG. 15 is mounted.

FIG. 18 is a plan view of the essential portions of a printed-wiring circuit board 30 on which the QFP is mounted, while FIG. 19 is a sectional view of the essential portions of the same. Symbol 20c in the figures denotes that NC pin of the QFP which is connected to an upper layer of wiring 31 or a lower layer of wiring 32, symbol 20a denotes the signal pin thereof, and symbol 20b denotes the supply voltage pin thereof.

In the case of mounting the QFP on the printed-wiring circuit board 30, the upper layer of wiring 31 and lower layer of wiring 32 of the printed-wiring circuit board 30 are sometimes electrically connected via the NC pin 20c of the QFP as illustrated in the figures, in accordance with the specifications of the printed-wiring circuit board 30. By way of example, peripheral circuit devices PH1, PH2 and a memory MC1 such as RAM or ROM are connected via the NC pin 20c, whereby the versatility of wiring design can be enhanced.

On this occasion, an overvoltage is sometimes applied to the bonding pad (NC pad) BP of the semiconductor chip 1A through the NC pin 20c. However, according to the CMOS gate array in this embodiment in which the insulator film underlying the bonding pad (NC pad) BP is thickened, the static damage of the insulator film intervening between the bonding pad (NC pad) BP and the semiconductor substrate 1 can be effectively prevented. Besides, when the NC pin 20c has diode characteristics in the case of such connection, it forms the cause of the malfunctions of the peripheral circuit devices PH1, PH2 and the memory MC1, and hence, it cannot be furnished with a protective circuit.

(Embodiment 2)

A semiconductor integrated circuit device in this embodiment is a microcomputer which includes the CMOS gate array in the embodiment 1.

Figure 20:
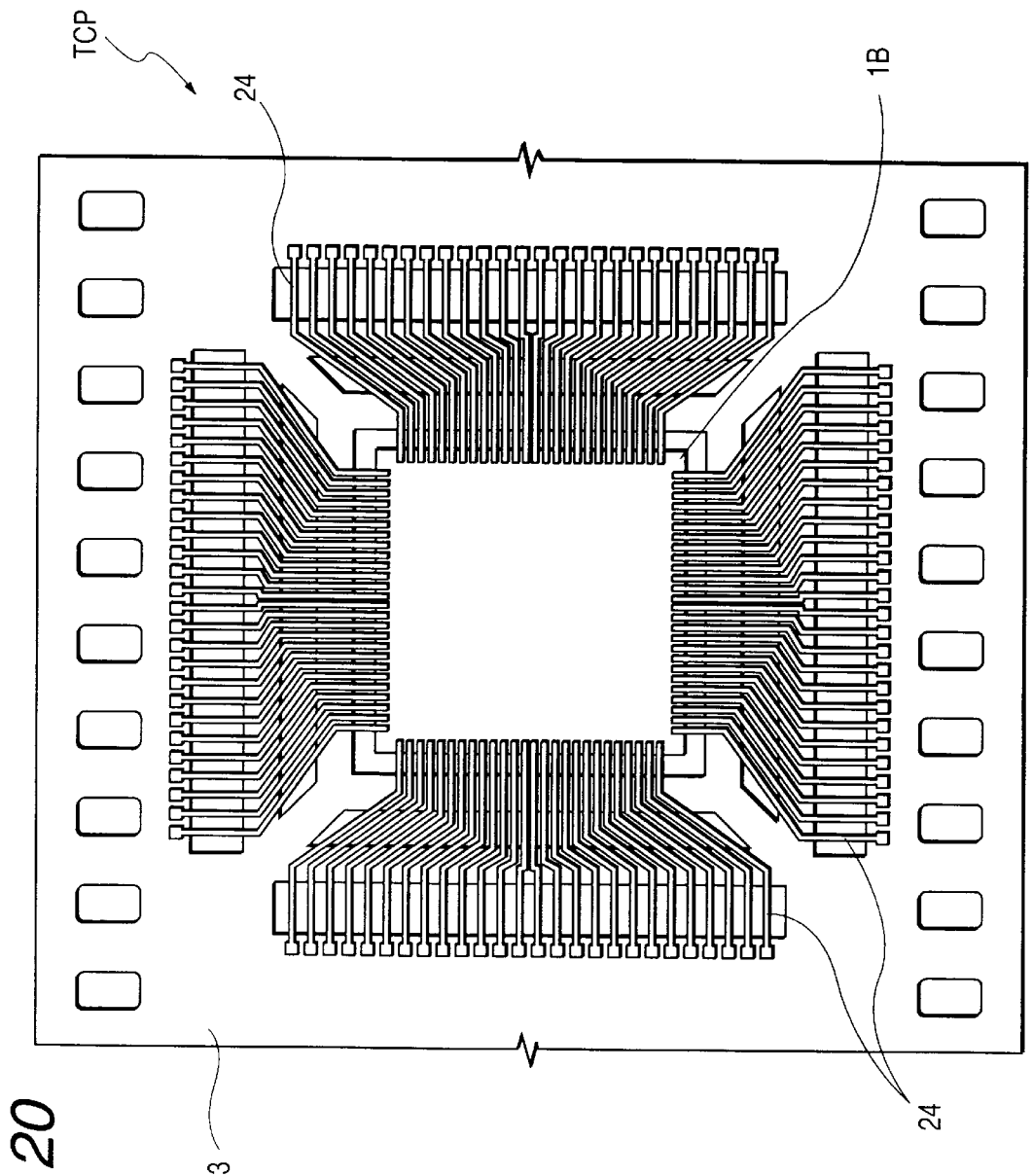
FIG. 20 is a schematic plan view of a TCP (Tape Carrier Package) in which a semiconductor chip formed with a microcomputer in another aspect of performance of the present invention is encapsulated.
Figure 21:
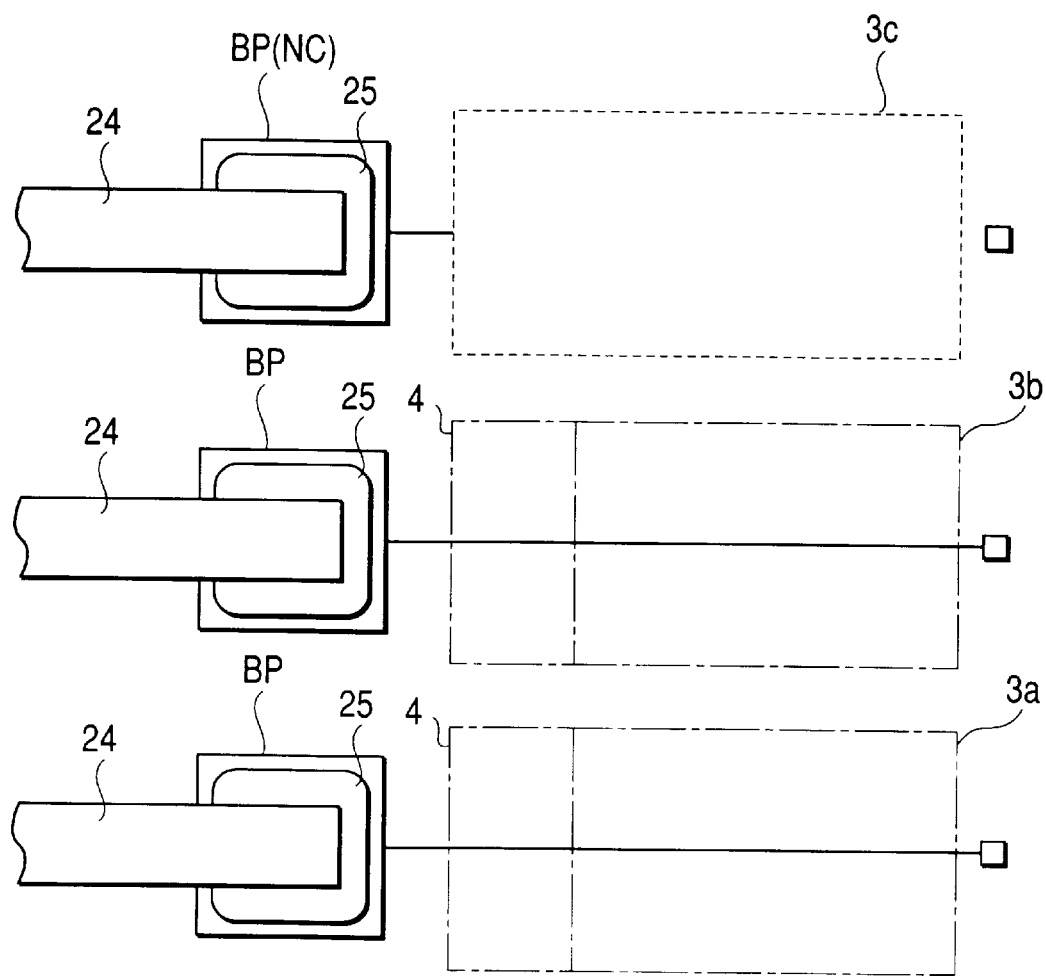
FIG. 21 is a plan view showing on an enlarged scale, part of a region where the bonding pads and I/O cells of the semiconductor chip encapsulated in the TCP depicted in FIG. 20 are formed.
Figure 22:
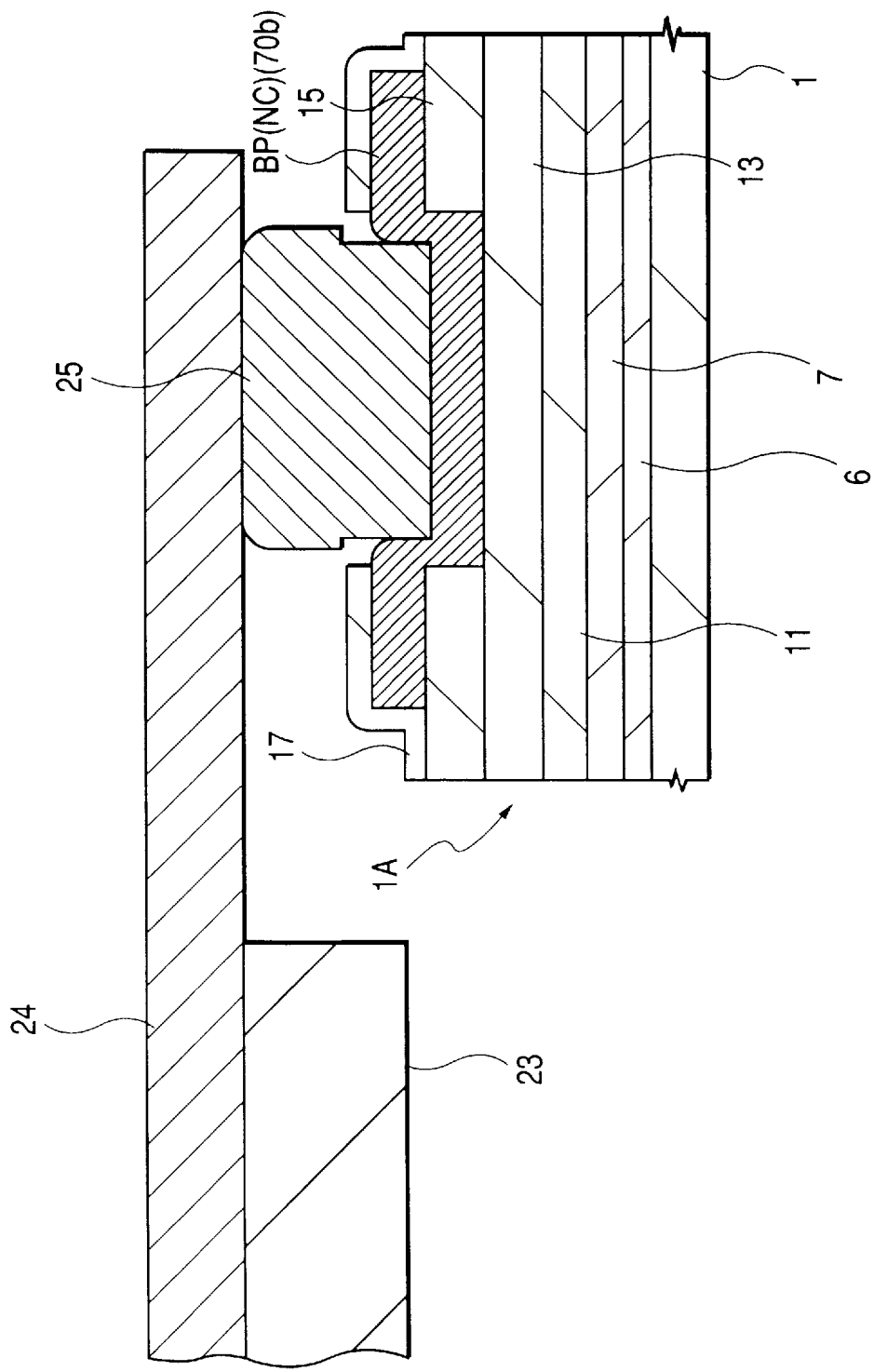
FIG. 22 is a sectional view showing on an enlarged scale, part of a region where the bonding pad and I/O cell of the semiconductor chip encapsulated in the TCP depicted in FIG. 20 are formed.

FIG. 20 is a schematic plan view of a TCP (Tape Carrier Package) in which a semiconductor chip 1B formed with the microcomputer is encapsulated, FIG. 21 is a plan view showing on an enlarged scale, parts of regions where the bonding pads BP and I/O cells 3 of the semiconductor chip 1B encapsulated in the TCP are formed, and FIG. 22 is a sectional view of the same. Numeral 23 in the figures designates the insulating tape (polyimide tape) of the TCP, numeral 24 each lead formed on one surface of the insulating tape 23, and numeral 25 each bump electrode of Au (gold) formed on the bonding pad BP of the semiconductor chip 1B.

As illustrated in the figures, the TCP is such that the leads 24 are bonded to all the bonding pads BP of the semiconductor chip 1B including the bonding pads (NC pads) BP correspondent to the I/O cells 3c not to be used. That is, the leads 24 are bonded without considering the positions of the bonding pads (NC pads) BP correspondent to the I/O cells 3a not-to-be-used which are arranged on the different places of the semiconductor chip 1B in accordance with logical specifications. In this way, the labor of fabricating the insulating tapes 23 of lead patterns which differ in the individual semiconductor chips 1B of different logical specifications can be saved, and a time period expended on tape design and the number of steps for fabricating the tape can be lessened, so that the cost of manufacture of the TCP can be curtailed.

Although, in the above, the invention made by the inventors has been concretely described on the basis of the embodiments, it is a matter of course that the present invention is not restricted to the foregoing embodiments, but that it is variously alterable within a scope not departing from the purport thereof.

Figure 23:
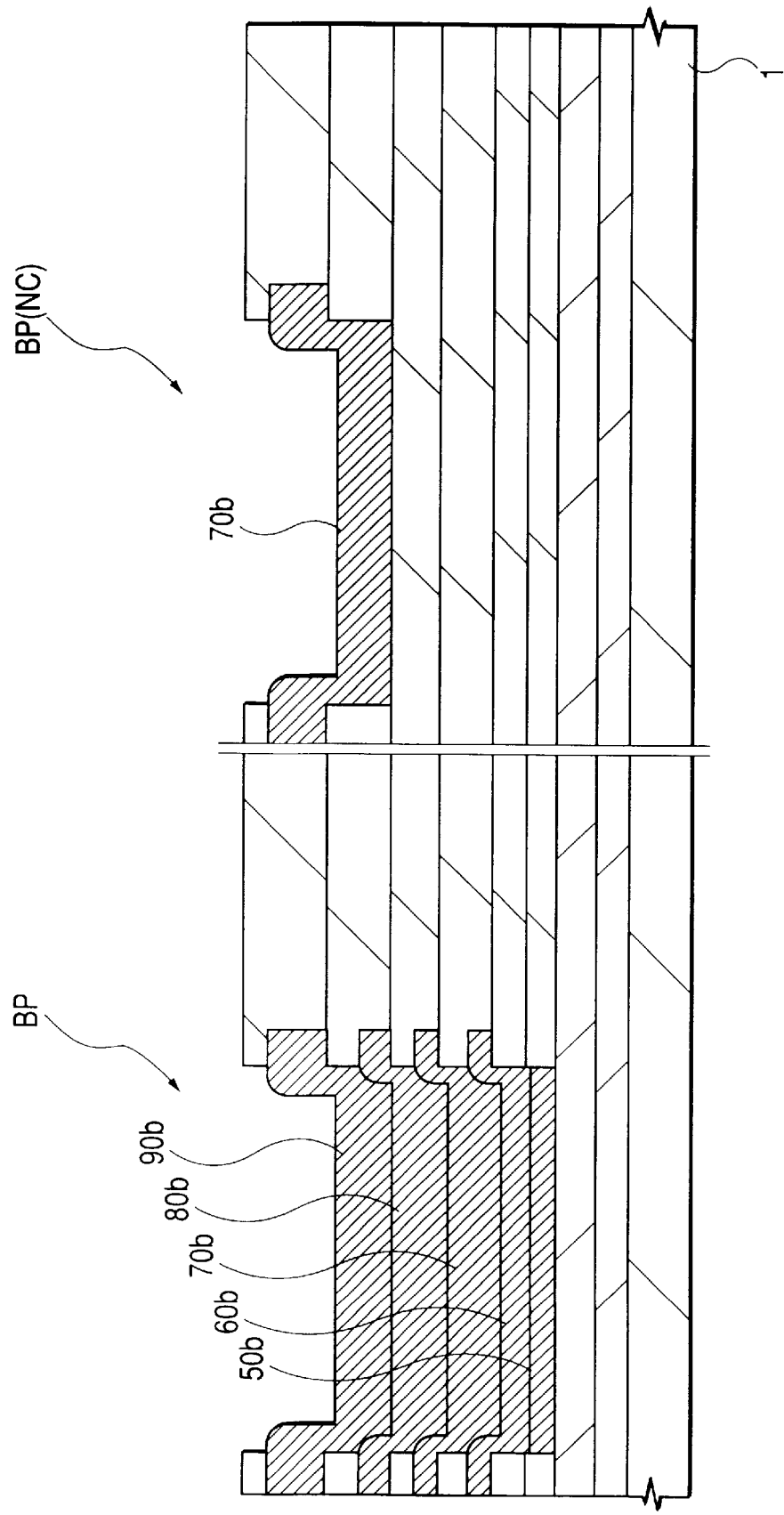
FIG. 23 is a sectional view showing regions where the bonding pads of a CMOS gate array in another aspect of performance of the present invention are formed.
Figure 24:
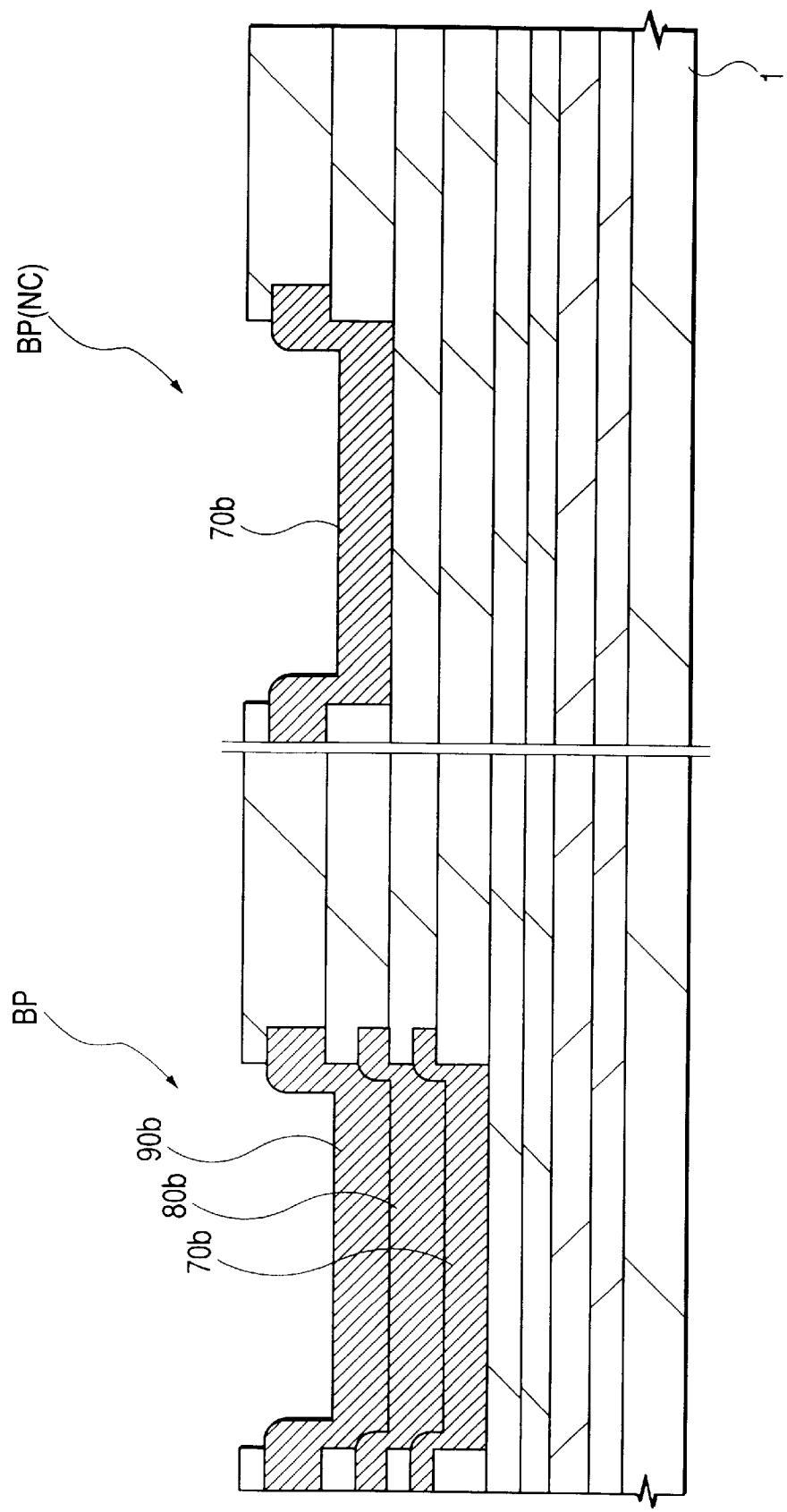
FIG. 24 is a sectional view showing regions where the bonding pads of a CMOS gate array in still another aspect of performance of the present invention are formed.

In the foregoing embodiments, the CMOS gate array having the three layers of wiring has been referred to. The present invention, however, is also applicable to a gate array having four or more layers of wiring, a microcomputer including this gate array, etc. By way of example, as illustrated in the right parts of FIGS. 23 and 24, in a CMOS gate array which has five layers of wiring, each NC pad BP(NC) correspondent to an I/O cell not to be used is formed only of the uppermost conductor layer (fifth conductor layer 90b), whereby the static damage strength of an NC pin can be enhanced. In this case, each bonding pad BP correspondent to an I/O cell other than the I/O cell not to be used is formed of, for example, the five conductor layers (first conductor layer 50b to fifth conductor layer 90b) (in the left part of FIG. 23) or three conductor layers (third conductor layer 70b to fifth conductor layer 90b) (in the left part of FIG. 24).

Figure 25:
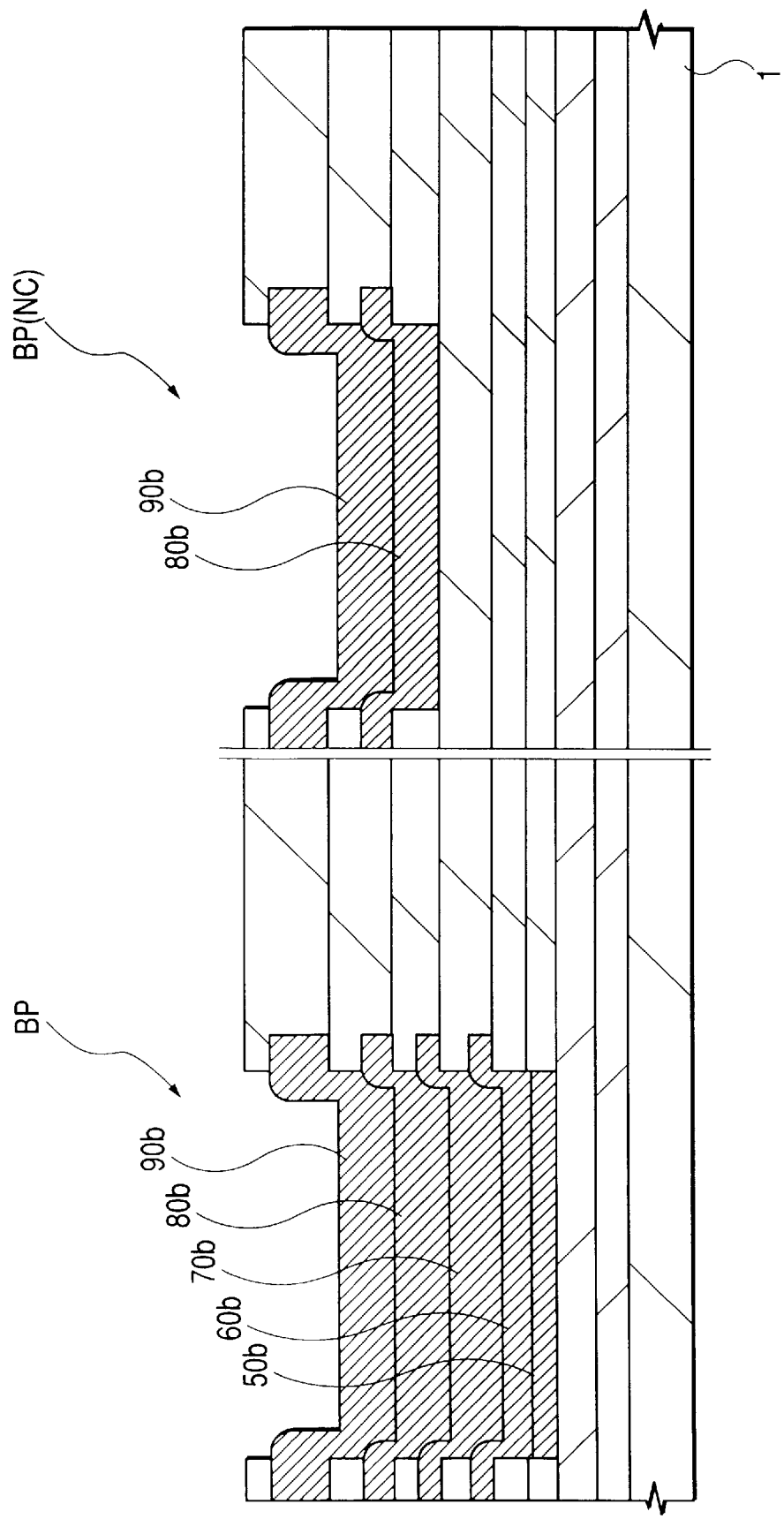
FIG. 25 is a sectional view showing regions where the bonding pads of a CMOS gate array in yet another aspect of performance of the present invention are formed.
Figure 26:
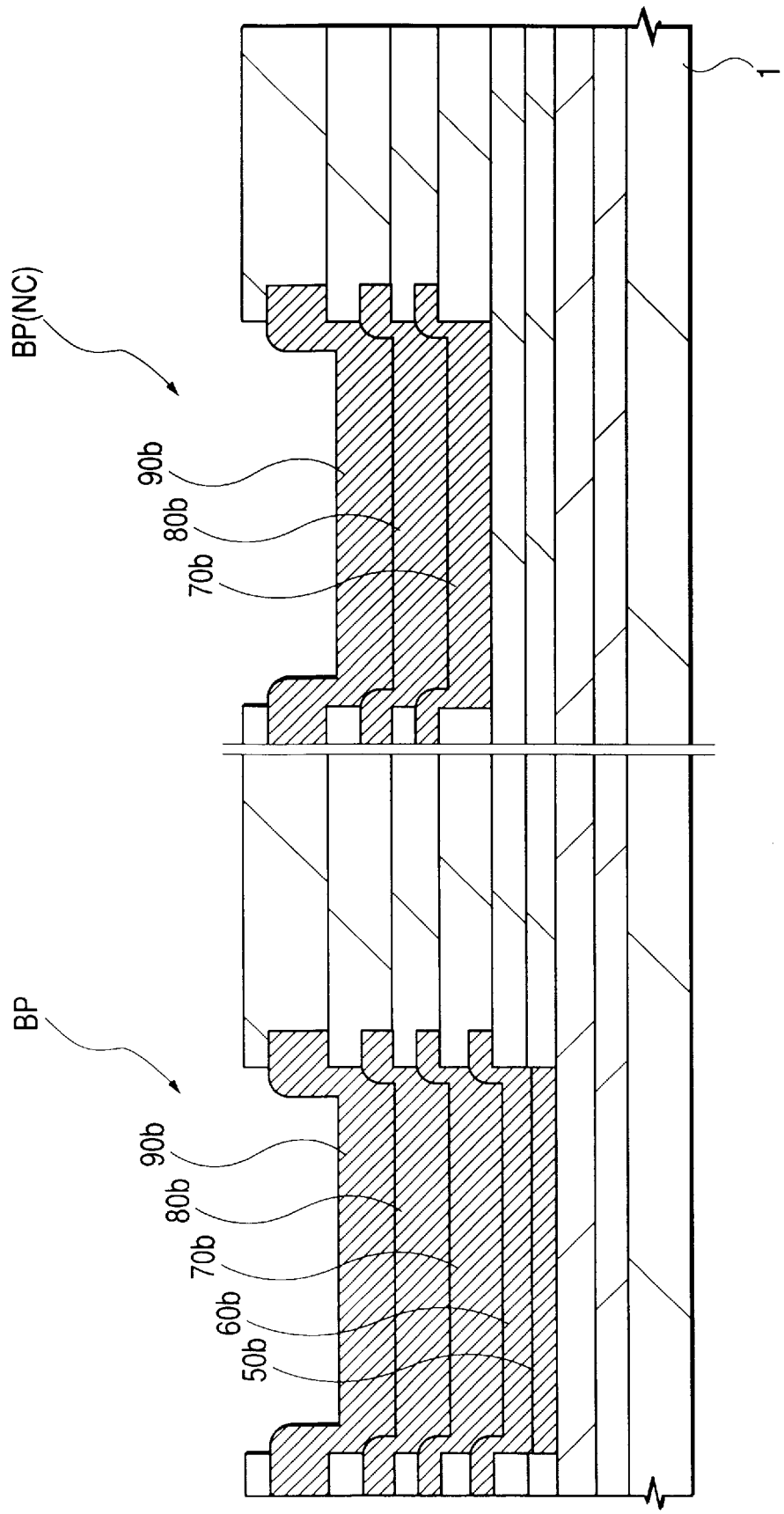
FIG. 26 is a sectional view showing regions where the bonding pads of a CMOS gate array in a further aspect of performance of the present invention are formed.

Alternatively, each NC pad BP correspondent to an I/O cell not to be used can be formed having conductor layers which include the same conductor layer as the uppermost layer of wiring, and the number of which is smaller than that of conductor layers of each bonding pad correspondent to an I/O cell different from the I/O cell not to be used. FIG. 25 illustrates an example in which the NC pad BP(NC) is formed of two conductor layers (fourth conductor layer 80b, and fifth conductor layer 90b), whereas the other bonding pad BP is formed of five conductor layers (first conductor layer 50b to fifth conductor layer 90b). In addition, FIG. 26 illustrates an example in which the NC pad BP(NC) is formed of three conductor layers (third conductor layer 70b, fourth conductor layer 80b, and fifth conductor layer 90b), whereas the other bonding pad BP is formed of five conductor layers (first conductor layer 50b to fifth conductor layer 90b). In a case where each NC pad BP(NC) is formed of a plurality of conductor layers as in these examples, the strength of the NC pad BP(NC) is heightened, and hence, the bondability thereof with Au (gold) wire is enhanced.

Figure 27:
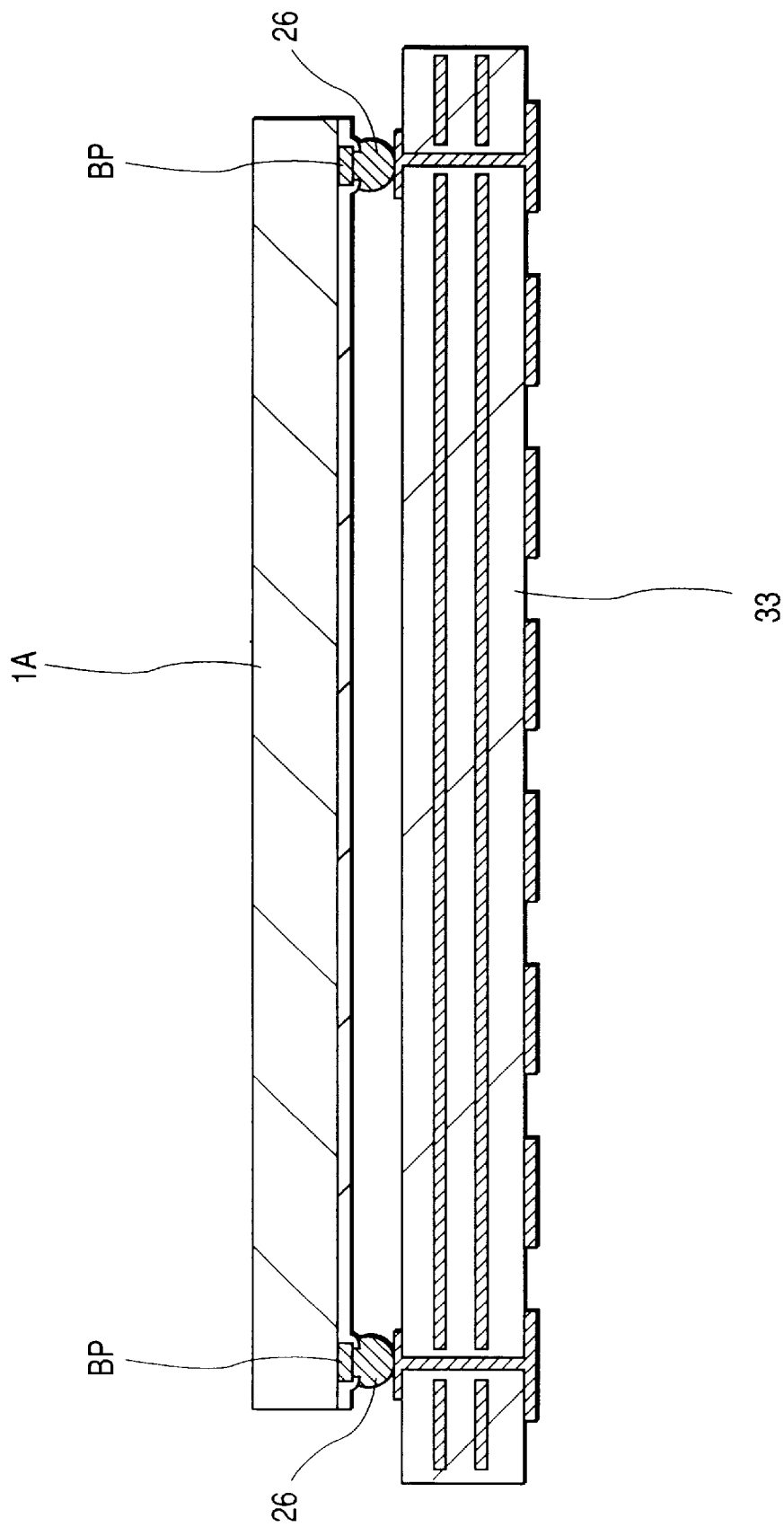
FIG. 27 is a sectional view of a package in which a semiconductor chip formed with a CMOS gate array in a different aspect of performance of the present invention is encapsulated.

The package in which the semiconductor chip formed with the logic LSI of the present invention is encapsulated, is not restricted to the wire bonding scheme (Embodiment 1) or the TCP (Embodiment 2). By way of example, the present invention is also applicable to a package in which, as illustrated in FIG. 27, a semiconductor chip 1A is mounted as a flip chip on a printed-wiring circuit board 33 through solder bumps 26 formed on the bonding pads BP of the semiconductor chip 1A. In this case, all the bonding pads BP of the semiconductor chip 1A including NC pads are formed with the solder bumps 26. In this way, the labor of forming the solder bumps 26 at positions which differ in the individual semiconductor chips 1A of different logical specifications can be saved, so that the cost of manufacture of the package can be curtailed.

Although the semiconductor integrated circuit device including the gate array has been referred to in each of the embodiments, the present invention is applicable to semiconductor integrated circuit devices including various application-specific ICs, such as an embedded array and a cell base IC. The present invention is extensively applicable to semiconductor integrated circuit devices of master slice method each having multilayer wiring of at least two layers, the wiring of each of which is laid by an automatic placement and routing system.

Effects which are attained by the present invention are briefly explained below.

According to the present invention, an insulator film which underlies each NC pad correspondent to an I/O cell not to be used is thickened, whereby the static damage strength of the NC pin can be heightened. Moreover, the connections of bonding pads with the external connection terminals of a package can be made common among semiconductor chips of different logical specifications, so that the cost of fabrication of the package can be curtailed.

What is claimed is:

1. A semiconductor integrated circuit device, comprising bonding pads which correspond to I/O cells to be used in accordance with logical specifications, and each of which is formed of a plurality of conductor layers; and bonding pads which correspond to I/O cells not to be used in accordance with the logical specifications, and each of which is formed of conductor layers that include the same conductor layer as the uppermost layer of wiring among the plurality of conductor layers and that are smaller in number than said plurality of conductor layers of each of the first-mentioned bonding pads.

2. A semiconductor integrated circuit device according to claim 1, wherein at least the input cell for a supply voltage in a logic integrated circuit, and the bonding pad corresponding thereto are electrically connected through the plurality of layers of wiring.

3. A semiconductor integrated circuit device according to claim 1, wherein an input protection circuit is formed at a stage preceding each of the I/O cells to be used, and it is not formed at a stage preceding each of the I/O cells not to be used.

4. A semiconductor integrated circuit device according to claim 1, wherein each of the second-mentioned bonding pads is formed only of said same conductor layer as said uppermost layer of wiring.

5. A semiconductor integrated circuit device according to claim 1, wherein three layers of wiring are laid, each of the second-mentioned bonding pads is formed only of the same conductor layer as the third layer of wiring among the three layers of wiring, and each of said first-mentioned bonding pads is formed of the three layers of conductor layers.

6. A semiconductor integrated circuit device according to claim 1, comprising either of a gate array and a microcomputer which has a gate array.

7. In a package wherein a semiconductor integrated circuit device according to claim 1 and leads are electrically connected through pieces of wire and are encapsulated, a package wherein the pieces of wire are connected to all of said bonding pads which include the second-mentioned bonding pads.

8. In a package wherein a semiconductor integrated circuit device according to claim 1 and leads are electrically connected through bump electrodes and are encapsulated, a package wherein the leads are connected to all of said bonding pads which include the second-mentioned bonding pads.

9. A semiconductor integrated circuit device according to claim 1, wherein a thickness of an insulator film which intervenes between the second-mentioned bonding pads and a semiconductor substrate is greater than that of an insulator film which intervenes between said first-mentioned bonding pads and the semiconductor substrate.

10. A semiconductor integrated circuit device, comprising:

an insulator film which is formed on a principal surface of a semiconductor substrate;

first bonding pads which overlie said insulator film, and which correspond to input/output cells not to be used, respectively; and second bonding pads which overlie said insulator film, and which correspond to input/output cells other than the input/output cells not to be used, respectively, the insulator film between the principal surface and said first bonding pads being thicker than the insulator film between said principal surface and said second bonding pads.

11. A semiconductor integrated circuit device according to claim 10, wherein each of said first bonding pads is formed of conductor layers the number of which is smaller than that of conductor layers of each of said second bonding pads.

12. A semiconductor integrated circuit device according to claim 10, wherein said first bonding pads and leads are electrically connected to construct non-connected pins, respectively.

13. A semiconductor integrated circuit device according to claim 10, wherein said semiconductor integrated circuit device is constructed by adopting a gate scheme.

14. An electron device comprising a first semiconductor package in which said semiconductor integrated circuit device according to claim 10 and a plurality of leads are encapsulated, a second semiconductor package, and a printed-wiring circuit board;

said first bonding pads and said leads are electrically connected to construct non-connected pins, respectively;

the non-connected pins and signal pins of said second semiconductor package being electrically connected to wiring lines of said printed-wiring circuit board.

15. A semiconductor integrated circuit device, comprising:

an insulator film which is formed on a principal surface of a semiconductor substrate;

first bonding pads which overlie said insulator film, and which correspond to input/output cells not to be used, respectively; and second bonding pads which overlie said insulator film, and to which supply voltages are applied;

the insulator film between the principal surface and said first bonding pads being thicker than the insulator film between said principal surface and said second bonding pads.

16. A semiconductor integrated circuit device according to claim 15, wherein each of said first bonding pads is formed of conductor layers the number of which is smaller than that of conductor layers of each of said second bonding pads.

17. A semiconductor integrated circuit device according to claim 16, wherein said first bonding pads and leads are electrically connected to construct non-connected pins, respectively.

18. A semiconductor integrated circuit device, comprising:

an insulator film which is formed on a principal surface of a semiconductor substrate;

first bonding pads which overlie said insulator film, and which correspond to input/output cells not to be used, respectively; and second bonding pads which overlie said insulator film, and which correspond to input/output cells for signals, respectively;

the insulator film between the principal surface and said first bonding pads being thicker than the insulator film between said principal surface and said second bonding pads.

19. A semiconductor integrated circuit device according to claim 18, wherein each of said first bonding pads is formed of conductor layers the number of which is smaller than that of conductor layers of each of said second bonding pads.

20. A semiconductor integrated circuit device according to claim 19, wherein said first bonding pads and leads are electrically connected to construct non-connected pins, respectively.

* * * * *